US012674090B2

(12) United States Patent
Zhang et al.

(10) Patent No.: US 12,674,090 B2
(45) Date of Patent: Jul. 7, 2026

(54) QUANTUM DOT MATERIAL AND PREPARATION METHOD, QUANTUM DOT LIGHT-EMITTING DIODE AND PREPARATION METHOD

(71) Applicant: TCL TECHNOLOGY GROUP CORPORATION, Huizhou (CN)

(72) Inventors: Xuanyu Zhang, Huizhou (CN); Wenyong Liu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 782 days.

(21) Appl. No.: 17/860,528

(22) Filed: Jul. 8, 2022

(65) Prior Publication Data

US 2022/0356394 A1 Nov. 10, 2022

Related U.S. Application Data

(63) Continuation of application No. PCT/CN2020/138645, filed on Dec. 23, 2020.

(30) Foreign Application Priority Data

Jun. 24, 2020 (CN) ........................ 202010589721.6

(51) Int. Cl.

| | |
|---|---|
| ***C09K 11/02*** | (2006.01) |
| ***C09K 11/88*** | (2006.01) |
| ***H01L 51/00*** | (2006.01) |
| ***H10K 85/60*** | (2023.01) |
| *B82Y 20/00* | (2011.01) |
| *B82Y 40/00* | (2011.01) |
| *H10K 50/115* | (2023.01) |

(52) U.S. Cl.
CPC .......... *C09K 11/025* (2013.01); *C09K 11/883* (2013.01); *H10K 85/60* (2023.02); *H10K 85/615* (2023.02); *B82Y 20/00* (2013.01); *B82Y 40/00* (2013.01); *H10K 50/115* (2023.02)

(58) Field of Classification Search
None
See application file for complete search history.

(56) References Cited

U.S. PATENT DOCUMENTS

| | | | | |
|---|---|---|---|---|
| 2015/0150981 | A1 | 6/2015 | Gref et al. | |
| 2017/0176854 | A1 * | 6/2017 | Park | G03F 7/033 |
| 2017/0350225 | A1 * | 12/2017 | Benoit | E21B 43/26 |

FOREIGN PATENT DOCUMENTS

| | | | |
|---|---|---|---|
| CN | 105185918 | A | 12/2015 |
| CN | 108102640 | A | 6/2018 |
| CN | 109868135 | A | 6/2019 |
| CN | 109928903 | A | 6/2019 |
| CN | 109935670 | A | 6/2019 |

(Continued)

OTHER PUBLICATIONS

English translation of Wang et al. (CN 109602919) (Year: 2019).*

(Continued)

*Primary Examiner* — Ronak C Patel
(74) *Attorney, Agent, or Firm* — Anova Law Group, PLLC

(57) ABSTRACT

A quantum dot material includes quantum dot particles and a first ligand bonded to a surface of the quantum dot particles. The first ligand is a metal-organic framework (MOF) monomer, and the MOF monomer includes at least three first active groups bonded to the quantum dot particles.

16 Claims, 3 Drawing Sheets

(56) References Cited

FOREIGN PATENT DOCUMENTS

| | | |
|---|---|---|
| CN | 109976089 A | 7/2019 |
| JP | 2005023151 A | 1/2005 |

OTHER PUBLICATIONS

English translation of Gref et al. (CN 104718214). (Year: 2015).*
English translation of Hibino et al. (WO 2019/188475). (Year: 2019).*
English translation of Cao et al. (CN 109935670) (Year: 2019).*
English translation of Li et al. (CN 105070849) (Year: 2015).*
World Intellectual Property Organization (WIPO) International Search Report for PCT/CN2020/138645 Mar. 22, 2021 6 Pages (Including Translation).
The China National Intellectual Property Administration (CNIPA) The First Office Action for Chinese Application 202010589721.6 Dec. 28, 2023 15 Pages (With Translation).
The World Intellectual Property Organization (WIPO) International Search Report for PCT/CN2020/138645 Mar. 22, 2021 6 pages (including English translation).
Huajun He et al., "Confinement of Perovskite-QDs within a Single MOF Crystal for Significantly Enhanced Multiphoton Excited Luminescence", Dec. 14, 2018, pp. 1-8, vol. 31, No. 6, Advanced Materials.
Jiejun Ren et al., "Dual-emitting CsPbX3@ZJU-28 (X=Cl, Br, I) Composites with Enhanced Stability and Unique Optical Properties for Multifunctional Applications", Nov. 27, 2019, pp. 1-10, vol. 39, Chemical Engineering Journal.
Rajnish Kaur et al., "Effcient photocatalytic degradation of rhodamine 6G with a quantum dot-metal organic framework nanocomposite", Apr. 18, 2016, pp. 620-627, vol. 154, Chemosphere.

* cited by examiner

QUANTUM DOT MATERIAL AND PREPARATION METHOD, QUANTUM DOT LIGHT-EMITTING DIODE AND PREPARATION METHOD

CROSS-REFERENCE TO RELATED APPLICATION

This application is a continuation of International Application No. PCT/CN2020/138645, filed on Dec. 23, 2020, which claims priority of Chinese Patent Application CN202010589721.6, filed on Jun. 24, 2020, the entire contents of all of which are incorporated herein by reference.

TECHNICAL FIELD

The present disclosure relates to the technical field of display technology and, more particularly, to a quantum dot material and a preparation method thereof, and a quantum dot light-emitting diode and a preparation method thereof.

BACKGROUND

Quantum dots, also known as semiconductor nanocrystals, usually include group II-VI or group III-V elements, and their particle sizes are smaller than or close to an exciton Bohr radius. After nearly 30 years of research and development, significant breakthroughs have been made in the development of quantum dot synthesis technology. The researches tend to be perfect on group II-VI quantum dots represented by CdSe having, for example, a nearly 100% photoluminescence efficiency, a peak-to-peak width as narrow as 20-30 nm, and a device efficiency and device lifespan of the red and green quantum dots close to the requirements of commercial applications. Since all high-quality quantum dots are synthesized using a full-solution synthesis method, they are suitable for film formation by solution processing methods such as spin coating and printing. Thus, QLED with quantum dots as a light-emitting layer is expected to become a strong competitor for the next-generation display technology.

However, quantum dot electroluminescent devices still have problems such as low efficiency and short lifespan. The spin-coating technology commonly used to construct high-performance QLED devices usually uses ZnO as an electron transport layer (ETL) of the QLED. However, due to a non-polar surface of the quantum dots and the poor contact with ZnO, it is difficult to inject electrons. In addition, electron mobility of the QLED device is higher than hole mobility of the same. As such, charge accumulation often occurs at an QD/ETL interface, thereby degrading the efficiency and the lifespan of the QLED device. In addition, a film structure of the quantum dot film formed by the solution method is a disordered loose structure, containing a large number of various defects, such as micropores, etc. Accumulation is likely to occur in certain directions, thereby causing poor uniformity and further degrading carrier migration effect.

SUMMARY

One aspect of the present disclosure provides a quantum dot material. The quantum dot material includes: quantum dot particles and a first ligand bonded to a surface of the quantum dot particles. The first ligand is a metal-organic framework (MOF) monomer, and the MOF monomer includes at least three first active groups bonded to the quantum dot particles.

Another aspect of the present disclosure provides a method for preparing a quantum dot material. The method includes: in an inert gas atmosphere, providing a fatty acid solution of a first ligand and first quantum dots; and mixing the fatty acid solution of the first ligand and the first quantum dots to form a mixed solution system, and performing a ligand exchange reaction under a first heating condition to prepare second quantum dots with the first ligand bonded to a surface of the second quantum dots. The first ligand is a metal-organic framework (MOF) monomer, and the MOF monomer includes at least three first active groups bonded to quantum dot particles of the first quantum dots.

Another aspect of the present disclosure provides a quantum dot light-emitting diode. The quantum dot light-emitting diode includes: an anode; a cathode arranged opposite to the anode; a quantum dot light-emitting layer disposed between the anode and the cathode; and an electron transport layer disposed between the quantum dot layer and the cathode. A material of the quantum dot light-emitting layer is: a quantum dot material including quantum dot particles and a first ligand bonded to a surface of the quantum dot particles, where the first ligand is a metal-organic framework (MOF) monomer, and the MOF monomer includes at least three first active groups bonded to the quantum dot particles; or a quantum dot material prepared by a method including: in an inert gas atmosphere, providing a fatty acid solution of the first ligand and first quantum dots; and mixing the fatty acid solution of the first ligand and the first quantum dots to form a mixed solution system, and performing a ligand exchange reaction under a first heating condition to prepare second quantum dots with the first ligand bonded to a surface of the second quantum dots.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
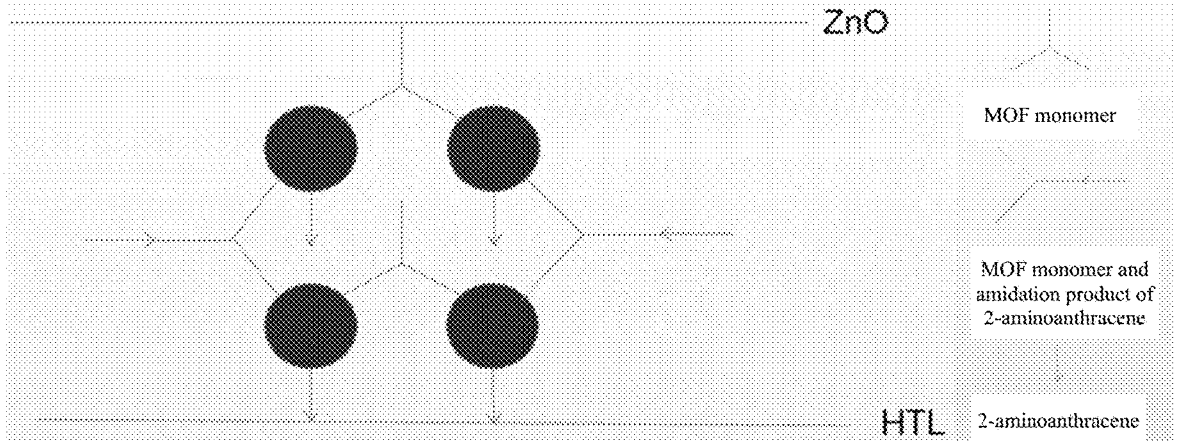
FIG. 1 is a schematic diagram of interfaces of a hole transport layer (HTL) and an electron transport layer (ETL) in an exemplary quantum dot thin film according to some embodiments of the present disclosure.

Embodiments of the present disclosure are described in detail below with reference to the accompanying drawings. It will be appreciated that the described embodiments are some rather than all of the embodiments of the present disclosure. Other embodiments obtained by those having ordinary skills in the art on the basis of the described embodiments without inventive efforts should fall within the scope of the present disclosure.

In the description of the present disclosure, it should be understood that the terms "first" and "second" are only used for description purposes, and should not be construed as indicating or implying relative importance or implicitly indicating the number of indicated technical features. Therefore, the features defined with "first" and "second" may explicitly or implicitly include one or more of these features. In the description of the present disclosure, "a plurality of" means two or more than two, unless otherwise specifically defined.

It should be understood that the term "and/or" used in the specification and the appended claims refers to any combination of one or more of the associated listed items and all possible combinations, and includes these combinations.

It should also be understood that references to "one embodiment" or "some embodiments" etc. in the specification means that one or more embodiments of the present disclosure include a specific feature, structure, or characteristic described in combination with the embodiment. Therefore, the sentences starting with "in one embodiment", "in some embodiments", "in another embodiment", "in some other embodiments", etc. appearing in different places in the specification are not necessarily referring to a same embodiment, but are referring to "one or more but not all embodiments" unless it is specifically emphasized otherwise. The terms "including", "including", "having" and their variations all refer to "including but not limited to", unless otherwise specifically emphasized.

A weight of a relevant component mentioned in the description of the embodiments of the present disclosure not only refers to a specific content of each component, but also indicates a weight ratio between components. Therefore, as long as it is in accordance with a relevant group in the description of the embodiments of the present disclosure, enlargement or reduction of the components in proportion is within the scope of the embodiments of the present disclosure. Specifically, the weight described in the specification of the embodiments of the present disclosure may be μg, mg, g, kg, and other known mass units in the chemical industry.

One aspect of the present disclosure provides a quantum dot material. The quantum dot material includes quantum dot particles and a first ligand bonded to surfaces of the quantum dot particles. The first ligand is a metal-organic framework (MOF) monomer, and the MOF monomer includes at least three first active groups bonded to the quantum dot particles.

In some embodiments, the quantum dot material includes the first ligand bonded to its surface, and the first ligand is the MOF monomer. On one hand, due to self-assembly properties of the MOF monomer, during formation of a quantum dot film, driven by the MOF monomer, the quantum dots with the MOF monomers bonded to the surfaces thereof are orderly arranged, thereby improving uniformity in a process of forming a quantum dot film. On the other hand, the surface of each quantum dot is combined with multiple MOF monomers at the same time to form a framework structure similar to MOF, thereby reducing surface defects of the quantum dots. At the same time, micropores between the MOF monomers in the framework structure similar to the MOF can be filled by the quantum dots, thereby improving crystallinity of the quantum dot film and resulting in a high-quality superlattice quantum dot structure. Both aspects act at the same time to form an ordered, high-quality superlattice structure (similar to the framework structure of the MOF). In this case, the ordered and high-quality superlattice structure solves the problems of defects in the quantum dot film, and loose and disordered structure of the quantum dot film. Thus, a transport capacity of carriers can be effectively increased, and conductivity of the quantum dot film can be improved.

When the above-described quantum dot material is used as a light-emitting layer material to form a quantum dot light-emitting diode, an ability of excitons to recombine in the light-emitting layer can be improved, charge accumulation at an interface between the quantum dot light-emitting layer and an electron transport layer can be reduced, and a problem of charge imbalance in a device caused by hole mobility substantially lower than electron mobility can be solved. As a result, a lifespan and a luminous efficiency of a quantum dot light-emitting device are improved.

Furthermore, because the first ligand includes more than three first active groups at the same time, one MOF monomer bonds multiple quantum fixed particles together at the same time. Thus, a distance between the quantum dots is shortened, a transmission distance of electrons between the quantum dots is reduced, and carrier migration ability of the quantum dots is further improved. In addition, in the quantum dot material provided by the present disclosure, each surface MOF monomer has a large steric hindrance, which prevents agglomeration between the quantum dots, thereby improving film processing performance.

In some embodiments, the MOF monomer is an organic monomer material used to form the MOF. The MOF monomer is used as the surface ligand of the quantum dot particles. After being bonded to the quantum dots, a structure similar to the MOF (quantum dots are equivalent to metal ions) is formed to obtain superlattice structure quantum dots. As a result, the quantum dot material is modified by the MOF monomer to reduce the surface defects of the quantum dots. At the same time, due to the self-assembly properties of the MOF, during the formation of the quantum dot film, driven by the MOF monomer, the quantum dots with the MOF monomers bonded to the surfaces thereof are orderly arranged to form the superlattice structure quantum dot film. The framework structure of the superlattice structure quantum dots improves transport performance of carriers and the conductivity of the quantum dot film, such that when being used as the quantum dot light-emitting layer of the quantum dot light-emitting diode, the framework structure improves recombination of excitons in the light-emitting layer and reduces the charge accumulation at the interface between the quantum dot light-emitting layer and the electron transport layer.

In some embodiments, the first ligand is selected from compounds having a structure shown in Formula 1 below, where $X^1$, $X^2$, and $X^3$ are the same or different first active groups:

Formula 1

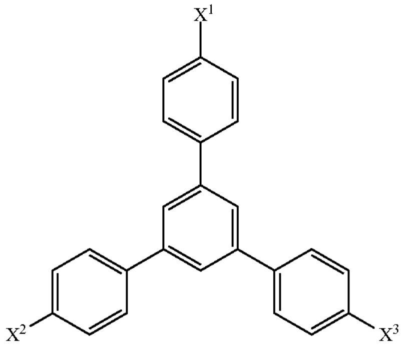

The compound shown in Formula 1 includes three first active groups bonded to the quantum dots, and the three first active groups can be bonded to three quantum dots, thereby weaving the quantum dot particles into a network structure to form a stable and orderly superlattice structure. The ligand structure on the surface of the quantum dot has a high degree of conjugation. Therefore, using the compound shown in Formula 1 as the surface ligand of the quantum dot can further improve the carrier transport performance of the quantum dot by virtue of the conjugation effect.

In some embodiments, the first active group is selected from one of a hydroxyl group, a carboxyl group, a mercapto group, and an amino group. It should be understood that in the first ligand, the three or more first active groups may be the same or different, as long as they are bonded to the quantum dots. In some embodiments, multiple first active groups in the first ligand are the same.

In addition, in some embodiments, in the quantum dot material, ligands on the surface of the quantum dot particles are only the first ligand.

As a second embodiment, the quantum dot material further includes a second ligand bonded to the surface of the quantum dot particles. The second ligand is a compound having at least two benzene rings, and the second ligand includes a second active group bonded to the quantum dot particles. In this case, when the quantum dot material is used as the light-emitting layer material of the quantum dot light-emitting diode, the second ligand has a strong affinity for the hole transport layer, and a non-polar end of the polybenzene ring structure is positively charged to be coupled with a positive potential on a surface of the hole transport layer, thereby enhancing the hole conductivity between the quantum dot light-emitting layer and the hole transport layer interface. At the same time, the second ligand facilitates reducing a contact angle between the quantum dots and the hole transport layer, such that both spreadability of the quantum dots and uniformity of film thickness are improved when the quantum dot film is formed by a solution processing method.

In some embodiments, the first ligands and the second ligands coexist between the quantum dot particles, resulting in a hyperconjugation resonance. The hyperconjugation resonance substantially enhances intracrystalline conductivity of the superlattice structure formed by the quantum dot layer, increases carrier mobility of the quantum dot film, improves the luminous efficiency of the quantum dot light-emitting device, reduces the charge accumulation at the interface between the quantum dot light-emitting layer and the electron transport layer, and extends the lifespan of the quantum dot light-emitting device.

In some embodiments, the second active group is selected from one of a hydroxyl group, a carboxyl group, a mercapto group, and an amino group. In some embodiments, reactivity between the second active group and the quantum dot is less than reactivity between the first active group and the quantum dot.

In some embodiments, the second ligand is selected from at least one of a fused ring with a benzene ring number of 2-6, biphenyl, or a hyperconjugated structure containing —Ar—C═C—Ar—, where Ar is a benzene ring. In the hyperconjugated structure containing —Ar—C═C—Ar—, a position of the second active group is not limited. The second active group can be bonded to a benzene ring or to a double-bond carbon atom. In this case, an appropriate size of the second ligand can control aggregation of the quantum dots within an appropriate range, and can prevent the quantum dot material from adversely affecting the conductivity due to the excessively long distance between the quantum dots.

In some embodiments, the second ligand is selected from at least one of the following Formula 2, Formula 3, or Formula 4, where $X^4$, $X^5$, and $X^6$ are the same or different second active groups, n and l are positive integers from 1 to 5.

Formula 2

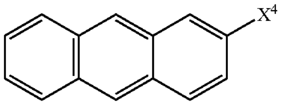

Formula 3

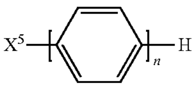

Formula 4

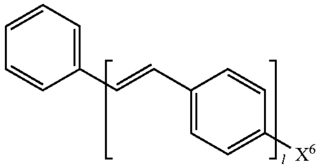

In some embodiments, the second ligand is selected from at least one of 2-aminoanthracene, biphenylmonoacetic acid, 4,4-stilbene dicarboxylic acid, biphenylmonoacetic acid, or 4,4-stilbene dicarboxylic acid.

In some embodiments, 1,3,5-tris(4-carboxyphenyl)benzene is used as the first ligand, and 2-aminoanthracene is used as the second ligand. In this case, when the quantum dot material is used as the light-emitting layer material of the quantum dot light-emitting diode, the 2-aminoanthracene ligand has a strong affinity with the hole transport layer. The non-polar end of the polybenzene ring that is positively charged is coupled with the positive potential on the surface of the hole transport layer material, thereby enhancing hole conductivity at an interface between the quantum dot light-emitting layer and the hole transport layer, reducing the contact angle between the quantum dot light-emitting layer and the hole transport layer, making the spreadability of the quantum dots more desirable in a spin coating process of forming the quantum dot film, and improving the uniformity of the film thickness of the formed quantum dot film.

In some embodiments, 1,3,5-tris(4-carboxyphenyl)benzene coordinates more than two quantum dots at the same time, connects the quantum dots together, shortens the distance between the quantum dots, and reduces the electron transmission distance between the quantum dots. As such, the polar hydrophilic end (carboxyl group, etc.) has the ability to donate electrons, the polar hydrophilic end that is not connected to the quantum dot is concentrated on an upper surface of the quantum dot film and is connected to the electron transport layer material. The polar hydrophilic end has a negative potential and a strong electron conductivity, and contacts with the electron transport layer material to improve the electron conductivity at the interface between the quantum dot light-emitting layer and the electron transport layer.

In addition, the contact angle between 1,3,5-tris(4-carboxyphenyl)benzene and the electron transport layer material such as ZnO is small. When the electron transport layer is deposited on the surface of the quantum dot light-emitting layer by the solution processing method, the electron transport layer material such as ZnO exhibits the strong spreadability on the quantum dot film, thereby improving the uniformity of the film thickness of the quantum dot film formed by the electron transport layer material such as ZnO.

In some embodiments, 1,3,5-tris(4-carboxyphenyl)benzene is used as the first ligand, and 2-aminoanthracene is used as the second ligand. At the same time, 7-benzene ring amidation product of 2-aminoanthracene and 1,3,5-tris(4-carboxyphenyl)benzene exists, that is, the quantum dot material contains 1,3,5-tris(4-carboxyphenyl)benzene,-aminoanthracene, and the 7-benzene ring amidation product of 2-aminoanthracene and 1,3,5-tris(4-carboxyphenyl)benzene.

In this case, as shown in FIG. 1, the 2-aminoanthracene ligand is suitable to transport holes, and 1,3,5-tris(4-carboxyphenyl)benzene is suitable to transport electrons. The 7-benzene ring amidation product has both hole and electron conductivity in the intermediate layer, and connects the quantum dots in the intermediate layer, thereby substantially improving the charge conductivity between the quantum dot layers, increasing the number of large molecules at the intermediate layer and the number of polybenzene rings of organic ligands. In a heat treatment process after the electron transport layer material is deposited by the solution processing method, the ligands are folded and interlaced in the limited interlayer space (rotation, folding and movement of organic molecules when being heated), and are crystallized. The hyperconjugation resonance effect resulted from the heat treatment process substantially enhances intracrystalline conductivity of the superlattice structure formed in the quantum dot layer, improves the carrier mobility of the quantum dot film, improves the luminous efficiency of the quantum dot light-emitting device, and reduces the charge accumulation at the interface between the transport layer and the quantum dot layer, thereby extending the lifespan of the quantum dot light-emitting device.

In some embodiments, a molar ratio of the first ligand to the second ligand is about 1:0.95~1.05. In this case, one first active group originally bonded to the surface of the quantum dot in the MOF is replaced by one second ligand. After the quantum dot material is formed into the quantum dot film, the first active group that is freed either serves as a surface ligand on the quantum dot film to contact with the electron transport layer, or is located between two adjacent quantum dot layers of the quantum dot film and is used to connect the two adjacent quantum dot layers (e.g., an upper quantum layer and a lower quantum dot layer) together. In some embodiments, the molar ratio of the first ligand to the second ligand is 1:1.

As a third embodiment, the quantum dot material further includes a third ligand bonded to the surface of the quantum dot particles. The third ligand is a compound with a general structural formula shown in Formula 5, where $X^7$ is a third active group bonded to the quantum dots, $R^1$ is $-(CH_2)_m-$, m is a positive integer, and m is approximately in the range of 1-10.

Formula 5

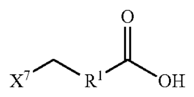

In this case, the MOF monomer and the compound represented by Formula 5 act as the ligands at the same time. The three-coordination point self-assembly properties of the MOF monomer are used to form a large MOF-like superlattice framework. One single MOF monomer is coordinated with multiple quantum dots. Each quantum dot has multiple ligands covering all the dangling bonds on an entire surface of the quantum dot. A connection force of the MOF monomer connects all the quantum dots together to form a large three-dimensional (3D) structure. The large 3D structure includes the large MOF-like superlattice framework and has a desired longitudinal conductivity. But at the same time, there are many gaps and micropores in the large 3D structure. In this case, the compound represented by Formula 5 is used as the second ligand. The gaps are filled by a quantum dot-second ligand-quantum dot structure formed by the second ligands, and a quantum dot-third ligand-quantum dot structure is used to extend outward in a chain-shape to fill in the gaps of the large 3D structure, surround the 3D framework longitudinally to form a horizontal structure. As a result, the large 3D structure has a large grain size. The large grain size of the large 3D structure facilitates an ultra-long-range carrier conductivity. Thus, the longest diffusion length of the carriers is increased, the carrier transport capacity of the quantum dot film is increased, the number of grain boundaries and the number of corresponding defects are reduced, and the luminous efficiency and the lifespan of the quantum dot light-emitting device are improved.

In some embodiments, the third active group is selected from one of a hydroxyl group, a carboxyl group, a mercapto group, and an amino group.

In some embodiments, the third ligand is selected from at least one of suberic acid, pimelic acid, or azelaic acid.

Figure 2:
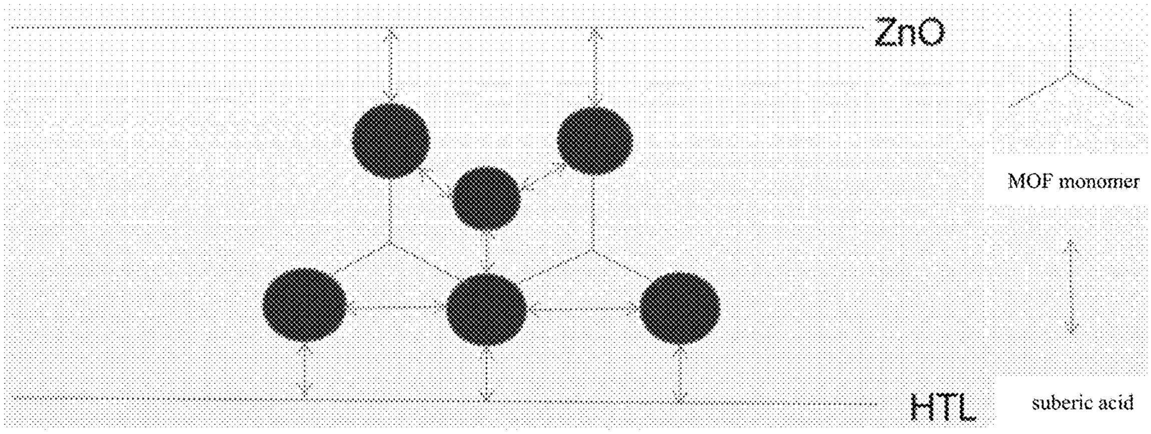
FIG. 2 is a schematic diagram of interfaces of a HTL and an ETL in another exemplary quantum dot thin film according to some embodiments of the present disclosure.

In some embodiments, 1,3,5-tris(4-carboxyphenyl)benzene is used as the first ligand, and suberic acid is used as the third ligand. In this case, 1,3,5-tris(4-carboxyphenyl) benzene and suberic acid are used as the ligands, and the tri-coordination point self-assembly properties of 1,3,5-tris (4-carboxyphenyl)benzene is used to form the large MOF-like superlattice framework. As shown in FIG. 2, one single MOF monomer is coordinated with three quantum dots. Each quantum dot has multiple ligands covering all the dangling bonds on the entire surface of the quantum dot. The connection force of the MOF monomer connects all the quantum dots together to form the large 3D structure. The large 3D structure has the desired longitudinal conductivity due to the large MOF-like superlattice framework arranged longitudinally.

But at the same time, there are many gaps and micropores in the large 3D structure. Using suberic acid ligands, the gaps are filled by suberic acid to form a quantum dot-suberic acid-quantum dot structure. The quantum dot-suberic acid-quantum dot structure extends outward in a chain-shape to fill in the gaps of the 3D framework, and surrounds the 3D framework longitudinally to form the horizontal structure. As a result, the 3D framework has a large grain size. The large grain size of the 3D framework facilitates the ultra-long-range carrier conductivity. Thus, the longest diffusion length of the carriers is increased, the carrier transport capacity of the quantum dot film is increased, the number of grain boundaries and the number of corresponding defects are reduced, and the luminous efficiency and the lifespan of the quantum dot light-emitting device are improved.

As a fourth embodiment, the quantum dot material further includes a fourth ligand bonded to the surface of the quantum dot particles. The fourth ligand is a compound with the general structural formula shown in Formula 6, where, $R^2$ is selected from carbon having the number of atoms ranging approximately from 1 to 6, one end of the compound structure includes a substituent of the fourth active group bonded to the quantum dot particles, and the fourth ligand is cross-linked by a double-bond polymerization reaction to form a network structure.

Formula 6

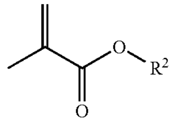

In this case, the surface of the quantum dot particles of the quantum dot material includes both the first ligand and the fourth ligand. The fourth ligand exists as a polymer formed by the polymerization reaction of the fourth ligand, which connects the ligands of different quantum dots, thereby not only connecting the quantum dots in the same layer, but also shortening the distance between the quantum dots in the same layer. Moreover, the quantum dots between different layers are also connected to shorten the distance between the quantum dots in different layers. The quantum dots are aggregated to form a chain-shaped polymer. The quantum dots are arranged in an orderly manner and are tightly connected by the ligands to form a preferred orientation, which provides a basic framework for the crystallization of the quantum dot layers. Due to the shortening of the distance between the quantum dots, the charge transport of the quantum dots between the layers and the charge transport of the quantum dots within the layers are both enhanced.

The chain-shaped polymer undergoes the heat treatment process to form flaky crystals through molecular folding and rotation. In this case, the MOF monomer is used as the first ligand, and one single MOF ligand is coordinated with multiple quantum dots. Each quantum dot has multiple ligands covering all the dangling bonds on the entire surface of the quantum dot. The connection force of the MOF monomer connects all the quantum dots together to form the large 3D structure. The large 3D structure has the desired longitudinal conductivity due to the large MOF-like superlattice framework arranged longitudinally.

When the two ligands exist at the same time, the MOF monomer is connected to the flaky crystals formed by the polymerization of the fourth ligand to form coordinated quantum dots through the self-assembly properties of the MOF monomer, and the spatial self-assembly properties of the MOF monomer is used to form the 3D structure. The flakey crystals are coordinated and connected to each other for reconstruction. Since the probability of coordination reconstruction is the same in all directions, and the self-assembly is the 3D structure, the macromolecular chain folds to form a spherical crystal structure, and an isotropic crystal structure is obtained. The spherical crystals have the same conductivity in all directions. As a result, electrical performance of the quantum dot film is improved, a uniform current distribution is achieved, and the lifespan and luminous efficiency of the quantum dot light-emitting device are improved. Forming the film structure with desired electrical performance is important.

In some embodiments, the fourth active group is selected from one of a hydroxyl group, a carboxyl group, a mercapto group, and an amino group.

In some embodiments, the fourth ligand is selected from at least one of hydroxyethyl methacrylate, hydroxypropyl methacrylate, or hydroxybutyl methacrylate.

In some embodiments, 1,3,5-tris(4-carboxyphenyl)benzene is used as the first ligand, and hydroxyethyl methacrylate is used as the second ligand. In this case, hydroxyethyl methacrylate connects the ligands of different quantum dots through the polymerization reaction between the quantum dot ligands, thereby not only connecting the quantum dots of the same layer, but also shortening the distance between the quantum dots of the same layer. The quantum dots of different layers are also connected to shorten the distance between the quantum dots of different layers, and are polymerized to form the chain-shaped polymer. The quantum dots are arranged in an orderly manner, and the ligands are tightly connected to form the preferred orientation, which provides the basic framework for the crystallization of the quantum dot layers. Due to the shortening of the distance between the quantum dots, the charge transport of the quantum dots between the layers and the charge transport of the quantum dots within the layers are both enhanced. Through the molecular folding and rotation during the 100° C. heat treatment process after ZnO is spin-coated, the chain-shaped polymer is formed into the flaky crystals.

Using 1,3,5-tris(4-carboxyphenyl)benzene as the ligand, one single MOF is coordinated with three quantum dots, and each quantum dot has multiple ligands covering all the dangling bonds on the entire surface of the quantum dot. The connection force of the MOF monomer connects all the quantum dots together to form the large 3D structure. The large 3D structure has the desired longitudinal conductivity due to the large MOF-like framework arranged longitudinally.

When the two ligands exist at the same time, through the self-assembly properties, 1,3,5-tris(4-carboxyphenyl)benzene is connected to the coordinated quantum dots formed during the HEMA polymerization process to form the flaky crystals. Through the spatial self-assembly properties of 1,3,5-tris(4-carboxyphenyl)benzene, the 3D structure is formed. The flaky crystals are coordinated and connected to each other for reconstruction. Since the probability of the coordination reconstruction is the same in all directions, and the self-assembly is the 3D structure, the macromolecular chain folds to form the spherical crystal structure, and the isotropic crystal structure is obtained. The spherical crystals have the same conductivity in all directions. As a result, the electrical performance of the quantum dot film is improved, the uniform current distribution is achieved, and the lifespan and luminous efficiency of the quantum dot light-emitting device are improved.

The quantum dot material provided by the embodiments of the present disclosure can be prepared by the following processes.

Figure 3:
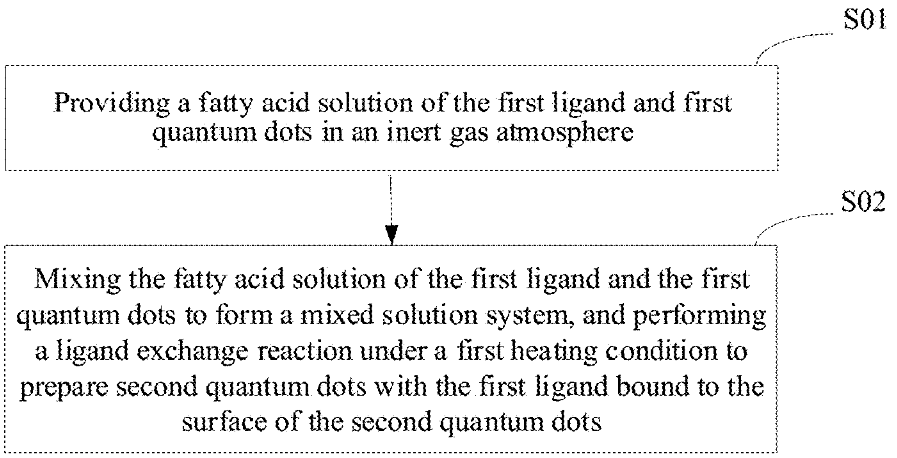
FIG. 3 is a flowchart of an exemplary method for preparing a quantum dot material according to some embodiment of the present disclosure.

FIG. 3 is a flowchart of an exemplary method for preparing a quantum dot material according to some embodiment of the present disclosure. As shown in FIG. 3, the method includes the following processes.

At S01. a fatty acid solution of the first ligand and first quantum dots are provided in an inert gas atmosphere.

At S02, the fatty acid solution of the first ligand and the first quantum dots are mixed to form a mixed solution system, and a ligand exchange reaction is performed under a first heating condition to prepare second quantum dots with the first ligand bonded to the surface of the second quantum dot. The first ligand is the MOF monomer, and the MOF monomer includes at least three first active groups bonded to the quantum dot particles of the first quantum dots.

The method for preparing the quantum dot material provided by the embodiment of the present disclosure includes: mixing the fatty acid solution of the first ligand with the first quantum dots to make the first ligand contact with the first quantum dots under the action of the fatty acid, and carrying out the ligand exchange reaction under the first heating condition to prepare the second quantum dots with the first ligand bonded to the surface of the second quantum dot. The method is simple and controllable, and can realize the bonding of the MOF monomer to the surface of the quantum dots. More importantly, the quantum dot material prepared by this method has the first ligand bonded to the surface, where the first ligand is the MOF monomer, such that an orderly arranged high-quality superlattice structure (similar to the framework structure of the MOF) can be formed. In this case, the orderly arranged high-quality superlattice structure can improve the transport capacity of the carriers and the conductivity of the quantum dot film.

When the quantum dot material is used as the light-emitting layer material of the quantum dot light-emitting diode, the ability of excitons to recombine in the light-emitting layer is improved, the charge accumulation at the interface between the quantum dot light-emitting layer and the electron transport layer is reduced, and the lifespan and luminous efficiency of the quantum dot light-emitting device are improved.

Specifically, in the inert gas atmosphere, the first ligand and the first quantum dots to be reacted are provided. The inert gas atmosphere refers to an inert gas atmosphere or a vacuum atmosphere. The first quantum dots refer to quantum dots including a ligand to be exchanged on the surface. The quantum dot material (excluding the surface ligand) in the first quantum dots may have a core structure or a core-shell structure. In some embodiments, the core compound and the shell compound of the quantum dot matrix can be individually selected from, but not limited to, group II-VI such as CdS, CdSe, CdTe, ZnS, ZnSe, ZnTe, ZnO, HgS, HgSe, HgTe, CdSeS, CdSeTe of. CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdSegSeZnSeS, CdZnTe, CdSegSeZnSeS, CdGZnTe, CdSegSeZnSeS, CdGZnTe, CdSegSeZnSeS, CdST; or group III-V such as GaN, GaP, GaAs, GaSb, AlN, AlP, AlAs, AlSb, InN, InP, InAs, InSb, GaNP, GaNAS, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSbSnS, InAlPSb; or group IV-VI such as, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe; or a combination of any one or more of the above.

In some embodiments, the first ligand is the MOF monomer, and the MOF monomer includes at least three first active groups bonded to the quantum dot particles. The way the first ligand improves the performance of the quantum dot material is same as above-described, and the detailed description is omitted herein.

In some embodiments, the first ligand is selected from compounds having the structure shown in Formula 1 below, where $X^1$, $X^2$, and $X^3$ are the same or different first active groups.

Formula 1

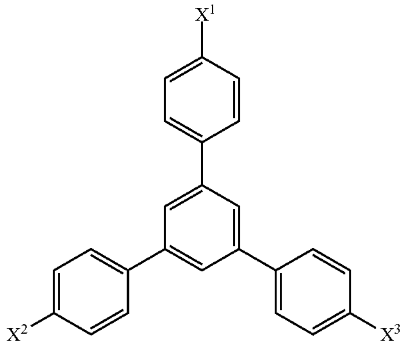

The compound shown in Formula 1 includes three first active groups that are bonded to the quantum dots, and the three first active groups can be bonded to three quantum dots, thereby weaving the quantum dot particles into the network structure to form the stable and orderly superlattice structure. The ligand structure on the surface of the quantum dot has the high degree of conjugation. Therefore, using the compound shown in Formula 1 as the surface ligand of the quantum dot can further improve the carrier transport performance of the quantum dot by virtue of the conjugation effect.

In some embodiments, the first active group is selected from one of a hydroxyl group, a carboxyl group, a mercapto group, and an amino group. It should be understood that in the first ligand, the three or more first active groups may be the same or different, as long as they are bonded to the quantum dots. In some embodiments, multiple first reactive groups in the first ligand are the same.

In some embodiments, mixing the fatty acid solution of the first ligand with the first quantum dots to form the mixed solution system includes: separately configuring the fatty acid solvent of the first ligand and the non-polar solution of the first quantum dots, and mixing them to obtain the mixed solution system. The non-polar solution of the first quantum dots is obtained by dispersing the quantum dots in a non-polar solvent. The use of the non-polar solvent improves the dispersibility of the quantum dots, especially the quantum dots with initial ligands on the surface, and prevents the quantum dots from agglomerating and precipitating in the polar solvent, which affects ligand exchange on the surface of the quantum dots. In the fatty acid solution of the first ligand, the fatty acid serves as the solvent of the first ligand, which provides a good dissolution state for the first ligand to participate in the reaction. More importantly, since the first quantum dots solution uses the non-polar solvent, the addition of the fatty acid can improve infiltration and penetration of the first ligand in the quantum dot solution to enhance the affinity and solubility of the first ligand to the quantum dot solution, and to promote the ligand exchange reaction. In some embodiments, the fatty acid in the fatty acid solution of the first ligand is selected from at least one of n-octanoic acid, acetic acid, n-hexanoic acid, n-butyric acid, or n-valeric acid.

In some embodiments, in the mixed solution system of the fatty acid solution of the first ligand and the first quantum dots, the molar ratio of the first ligand to the first quantum dots is about 50~100:1, such that the first ligand and the surface ligands of the first quantum dots are fully exchanged to obtain the second quantum dots with the first ligand bonded to the surface. If the relative content of the first ligand is too high, for example, higher than 100:1, too much ligand will significantly increase the polarity of the quantum dots, resulting in easy precipitation of the quantum dots.

In the first embodiment, the first quantum dots are quantum dots including an initial ligand on the surface, and the initial ligand is usually a surface ligand introduced during the preparation of the quantum dot, usually an oily ligand, such as oleic acid. In this case, by performing the ligand exchange reaction under the first heating condition, the initial ligand on the surface of the first quantum dots can be replaced with the first ligand. Specifically, the first ligand is bonded to the surface of the first quantum dots through the first active group to form the second quantum dots with the first ligand bonded to the surface.

In the step of carrying out the ligand exchange reaction under the first heating condition, a temperature of the first heating condition is approximately between 100° C. and 200° C., and a reaction time of the ligand exchange reaction is approximately between 20 min and 40 min. If the temperature of the first heating condition is too low or the reaction time is too short, it is difficult to effectively exchange the surface ligands of the first quantum dots, and even the ligand exchange reaction fails to occur effectively. If the temperature of the first heating condition is too high or the reaction time is too long, on one hand, hetero-side reactions are likely to occur, which affects the effect of the quantum dot ligand exchange, and introduces difficult-to-remove impurities in the quantum dot; on the other hand, an excessively high temperature will reduce the activity of the exchange reaction and affect the effect of the ligand exchange. In addition, the excessively high temperature is likely to cause the volatilization of the fatty acids, which is not conducive to the contact between the first ligand and the first quantum dots, and increase the difficulty for the ligand exchange to occur between the first quantum dots and the first ligand.

In the second embodiment, the first quantum dots are quantum dots with the third ligand bonded to the surface, and the surface of the second quantum dots is bonded with the first ligand and the third ligand at the same time. At this time, in the process of carrying out the ligand exchange reaction of the fatty acid solution of the first ligand and the mixed solution system of the first quantum dots under the first heating condition, the first ligand will replace a part of the third ligand on the surface of the first quantum dots to obtain the second quantum dots with both the first ligand and the third ligand bonded to the surface at the same time. That is, the surface of the second quantum dots is bonded with both the first ligand and the third ligand at the same time. Specifically, the third ligand is a compound with the general structural formula shown in Formula 5, where, $X^7$ is the third active group bonded to the quantum dot, $R^1$ is —$(CH_2)_m$—, and m is a positive integer and m is in the range of 1~10.

Formula 5

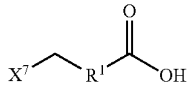

In this case, the MOF monomer and the compound represented by Formula 5 act as the ligands at the same time. The three-coordination point self-assembly properties of the MOF monomer are used to form the large MOF-like superlattice framework. One single MOF monomer is coordinated with multiple quantum dots, and each quantum dot has multiple ligands covering all the dangling bonds on the entire surface of the quantum dot. The connection force of the MOF monomer connects all the quantum dots together to form the large 3D structure. The large 3D structure has the desired longitudinal conductivity due to the large MOF-like framework arranged longitudinally.

But at the same time, there are many gaps and micropores in the large 3D structure. At this time, the compound represented by Formula 5 is used as the second ligand. The gaps are filled by the quantum dot-second ligand-quantum dot structure formed by the second ligand. The quantum dot-third ligand-quantum dot structure extends outward in the chain-shape to fill in the gaps of the 3D framework, and surrounds the 3D framework longitudinally to form the horizontal structure. As a result, the 3D framework has a large grain size. The large grain size of the 3D framework facilitates the ultra-long-range carrier conductivity. Thus, the longest diffusion length of the carriers is increased, the carrier transport capacity of the quantum dot film is increased, the number of grain boundaries and the number of corresponding defects are reduced, and the luminous efficiency and the lifespan of the quantum dot light-emitting device are improved.

In some embodiments, the third active group is selected from one of a hydroxyl group, a carboxyl group, a mercapto group, and an amino group.

In some embodiments, the third ligand is selected from at least one of suberic acid, pimelic acid, or azelaic acid.

In some embodiments, 1,3,5-tris(4-carboxyphenyl)benzene is used as the first ligand, and suberic acid is used as the third ligand.

In some embodiments, when the first quantum dots are quantum dots with the third ligand bonded to the surface, the method for preparing the first quantum dots includes the following processes.

At S011, in the inert gas atmosphere, a mixed solution system of a fatty acid solution of compound A and an initial quantum dot are provided, and a ligand exchange reaction is performed under the third heating condition to prepare the quantum dot with compound A bonded to the surface. The general formula of the structure of compound A is as follows. $X^7$ is the third active group bonded to the quantum dot. $R^1$ is —$(CH_2)_m$—. $R^3$ is a linear $C_sH_{2s+1}$. m and s are positive integers, and s+m is in the range of 2~12.

Compound A

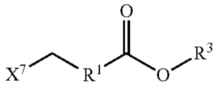

In this step, in the inert gas atmosphere, the compound A to be reacted and the initial quantum dot are provided. The inert gas atmosphere refers to an inert gas atmosphere or a vacuum atmosphere. The initial quantum dot refers to quantum dots with initial ligands on the surface. The quantum dot material in the initial quantum dots (excluding surface ligands) is the same as before. For the description of the quantum dot material, references can be made to the previous embodiments, and detailed description is omitted herein.

In some embodiments, in the compound A, $X^7$ is the third active group bonded to the quantum dots, $R^1$ is $-(CH_2)_m-$, $R^3$ is linear $C_sH_{2s+1}$, m, s are positive integers, and s+m is in the range of 2~12. In this case, under the third heating condition, the compound A can replace the surface ligand of the initial quantum dots, and can bind to the surface of the quantum dots through the third active group to obtain the first quantum dots with the third ligand bonded to the surface.

Specifically, in the compound A, the ester group can be hydrolyzed in the step S012 as follows to obtain the second ligand including the carboxyl group. s+m is in the range of 2~12. In this case, because carbon atoms in the compound A have an appropriate length, the compound A has smaller steric hindrance and better solubility, thereby reducing difficulty of introducing the compound A onto the surface of the quantum dots. In some embodiments, the compound A is selected from at least one of monomethyl suberate, monoethyl pimelate, or monoethyl azelate.

In some embodiments, providing the fatty acid solution of the compound A and the mixed solution system of the initial quantum dots includes: separately configuring a fatty acid solvent of the compound A and a non-polar solution of the initial quantum dots, and mixing them to obtain the mixed solution system. The non-polar solution of the initial quantum dots is obtained by dispersing the quantum dots in a non-polar solvent. The use of the non-polar solvent can improve the dispersibility of the initial quantum dots, and can prevent the initial quantum dots from the agglomeration and precipitation in the polar solvent, which affects the ligand exchange on the surface of the quantum dots.

In the fatty acid solution of the compound A, the fatty acid is used as the solvent of the compound A, which provides a good dissolution state for the compound A to participate in the ligand exchange reaction. More importantly, since the initial quantum dot solution uses the non-polar solvent, the addition of the fatty acid can improve the infiltration and penetration of the compound A in the initial quantum dot solution to enhance the affinity and solubility of the compound A to the initial quantum dot solution, so as to promote the ligand exchange reaction. In some embodiments, the fatty acid in the fatty acid solution of the compound A is selected from at least one of n-octanoic acid, acetic acid, n-hexanoic acid, n-butyric acid, or n-valeric acid.

In some embodiments, in the mixed solution system of the fatty acid solution of the compound A and the initial quantum dots, the molar ratio of the compound A to the initial quantum dots is about 50~100:1, such that the surface ligands of the compound A and the initial quantum dots are sufficiently exchanged to obtain the first quantum dots with the compound A bonded to the surface. If the relative content of the compound A is too high, for example, higher than 100:1, there will be too many ligands, which will significantly increase the polarity of the quantum dots and cause the quantum dots to easily precipitate. In addition, in the step of mixing the fatty acid solution of the first ligand and the first quantum dots to form the mixed solution system, the molar ratio of the compound A to the first ligand is configured to be in the range of 1:1 to 3:1 to obtain the second quantum dots with the molar ratio of the surface-bonded second ligand to the first ligand in the range of 1:1 to 3:1. As a result, the large 3D structure has a large grain size. The large grain size of the large 3D structure facilitates the ultra-long-range carrier conductivity.

In some embodiments, in the step of carrying out the ligand exchange reaction under the third heating condition, the reaction temperature is in the range of 100° C. to 150° C., and the reaction time is in the range of 1 h to 2 h. In the step of carrying out the ligand exchange reaction under the first heating condition, the reaction temperature is in the range of 100° C. to 200° C., and the reaction time is in the range of 8 h to 16 h. If the reaction temperature of the third heating condition is too low or the reaction time is too short, it is difficult to effectively exchange the surface ligands of the initial quantum dots, and even the ligand exchange reaction fails to occur effectively. If the temperature of the third heating condition is too high or the reaction time is too long, on one hand, the hetero-side reactions are likely to occur, which affects the effect of quantum dot ligand exchange, and introduces difficult-to-remove impurities in the quantum dot; on the other hand, the excessively high temperature will reduce the activity of the exchange reaction and affect the effect of the ligand exchange.

In addition, the excessively high temperature is likely to cause the volatilization of the fatty acids, which is not conducive to the contact between the compound A and the initial quantum dots, and increases the difficulty for the ligand exchange to occur between the initial quantum dots and the compound A. Further, in the step of carrying out the ligand exchange reaction under the first heating condition, the reaction temperature of the first heating condition is in the range of 60° C.~90° C., and the reaction time of the ligand exchange reaction is in the range of 4 h~14 h, to promote the ligand exchange reaction between the first ligand and the third ligand on the surface of the first quantum dot.

At S012, the compound A on the surface of the quantum dots is hydrolyzed to obtain the first quantum dots with the second ligand bonded to the surface.

In some embodiments, hydrolyzing the compound A on the surface of the quantum dots includes: adding a mixture of fatty acid and ethanol to the quantum dots with the compound A bonded to the surface, and hydrolyzing the ester group in the compound A at the reaction temperature in the range of 100° C. to 150° C. for the reaction time in the range of 4 h~8 h to obtain the second ligand represented by Formula 2.

As the third embodiment, the first quantum dots have the fourth ligand bonded to the surface, and the surface of the second quantum dots simultaneously binds the first ligand and the fourth ligand. The fourth ligand is a compound with the general structural formula shown in Formula 6, where, $R^2$ is selected from carbon having the number of atoms ranging approximately from 1 to 6 and includes a substituent of the fourth active group bonded to the quantum dot particles at the end.

Formula 6

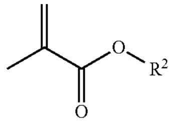

In this case, the surface of the quantum dot particles of the quantum dot material includes both the first ligand and the fourth ligand. The fourth ligand exists as the polymer formed by the polymerization reaction of the fourth ligand, which connects the ligands of different quantum dots, thereby not only connecting the quantum dots in the same layer, but also shortening the distance between the quantum dots in the same layer. Moreover, the quantum dots between different layers are also connected to shorten the distance between the quantum dots in the layers. The quantum dots are aggregated to form the chain-shaped polymer. The quantum dots are arranged in an orderly manner and are tightly connected by the ligands to form a preferred orientation, which provides the basic framework for the crystallization of the quantum dot layer. Due to the shortening of the distance between the quantum dots, the charge transport of the quantum dots between the layers and the charge transport of the quantum dots within the layers are both enhanced.

The chain-shaped polymer undergoes the heat treatment process to form the flaky crystals through molecular folding and rotation. In this case, the MOF monomer is used as the first ligand, and one single MOF ligand is coordinated with multiple quantum dots. Each quantum dot has multiple ligands covering all the dangling bonds on the entire surface of the quantum dot. The connection force of the MOF monomer connects all the quantum dots together to form the large 3D structure. The large 3D structure has the desired longitudinal conductivity due to the large MOF-like superlattice framework arranged longitudinally.

When the two ligands exist at the same time, the MOF monomer is connected to the flaky crystals formed by the polymerization of the fourth ligand to form the coordinated quantum dots through the self-assembly properties of the MOF monomer, and the spatial self-assembly properties of the MOF monomer is used to form the 3D structure. The flaky crystals are coordinated and connected to each other for reconstruction. Since the probability of coordination reconstruction is the same in all directions, and the self-assembly is the 3D structure, the macromolecular chain folds to form the spherical crystal structure, and the isotropic crystal structure is obtained. The spherical crystals have the same conductivity in all directions. As a result, the electrical performance of the quantum dot film is improved, the uniform current distribution is achieved, and the lifespan and luminous efficiency of the quantum dot light-emitting device are improved. Forming the film structure with the desired electrical performance is important.

In some embodiments, the fourth active group is selected from one of a hydroxyl group, a carboxyl group, a mercapto group, and an amino group.

In some embodiments, the fourth ligand is selected from at least one of hydroxyethyl methacrylate, hydroxypropyl methacrylate, or hydroxybutyl methacrylate.

In some embodiments, 1,3,5-tris(4-carboxyphenyl)benzene is used as the first ligand, and hydroxyethyl methacrylate is used as the second ligand.

When the first quantum dots are quantum dots with the fourth ligand bonded to the surface, in some embodiments, preparing the first quantum dots includes: in the inert gas atmosphere, providing the fatty acid solution of the fourth ligand and the mixed solution system of the initial quantum dot, and carrying out the ligand exchange reaction under the fourth heating condition to prepare the first quantum dots with the fourth ligand bonded to the surface.

After preparing the second quantum dots with the first ligand bonded to the surface, the method further includes: adding a mixed solution including an initiator and a crosslinking agent to the second quantum dots, and heating to make the first ligand on the surface of the second quantum dots polymerize.

That is, the method for preparing the first quantum dots includes the following processes.

At S013, in the inert gas atmosphere, a mixed solution system of the fatty acid solution of the fourth ligand and the initial quantum dot is provided, and a ligand exchange reaction under the fourth heating condition is performed to prepare the first quantum dots with the fourth ligand bonded to the surface.

At S014, in the inert gas atmosphere, the fatty acid solution of the first ligand and the first quantum dots are mixed to form a mixed solution system, and the ligand exchange reaction is performed under the first heating condition to prepare the second quantum dots with the first ligand bonded to the surface.

At S015, a mixed solution including the initiator and the crosslinking agent is added to the second quantum dots, and the mixed solution is heated to cause the first ligand on the surface of the second quantum dots to undergo polymerization.

Specifically, in step S013, the inert gas atmosphere refers to an inert gas atmosphere or a vacuum atmosphere. The initial quantum dot refers to a quantum dot with an initial ligand on the surface. The quantum dot material in the initial quantum dot (excluding surface ligand) is the same as before, and detailed description thereof is omitted herein.

In some embodiments, providing the fatty acid solution of the fourth ligand and the mixed solution system of the first quantum dots includes: separately configuring the fatty acid solvent of the fourth ligand and the non-polar solution of the first quantum dots, and mixing them to obtain the mixed solution system. The non-polar solution of the first quantum dots is obtained by dispersing the quantum dots in a non-polar solvent. The use of the non-polar solvent can improve the dispersibility of the quantum dots, especially the quantum dots with the initial ligands on the surface, and can prevent the quantum dots from agglomerating and precipitating in the polar solvent, which affects ligand exchange on the surface of the quantum dots. In the fatty acid solution of the fourth ligand, the fatty acid serves as the solvent of the fourth ligand, which provides a good dissolution state for the fourth ligand to participate in the reaction. More importantly, since the first quantum dots solution uses the non-polar solvent, the addition of the fatty acid can improve the infiltration and penetration of the fourth ligand in the quantum dot solution to enhance the affinity and solubility of the fourth ligand to the quantum dot solution to promote the ligand exchange reaction. In some embodiments, the fatty acid in the fatty acid solution of the first ligand is selected from at least one of n-octanoic acid, acetic acid, n-hexanoic acid, n-butyric acid, or n-valeric acid.

In some embodiments, in the mixed solution system of the fatty acid solution of the fourth ligand and the first quantum dots, the molar ratio of the fourth ligand to the first quantum dots is about 50-100:1, such that the fourth ligand and the surface ligand of the first quantum dots are fully exchanged to obtain the initial quantum dots with the fourth ligand bonded to the surface. If the relative content of the fourth ligand is too high, for example, higher than 100:1, too much ligand will significantly increase the polarity of the quantum dots, causing the quantum dots to easily precipitate.

In some embodiments, the ligand exchange reaction is performed under the fourth heating condition, and the initial ligand on the surface of the initial quantum dot can be replaced with the fourth ligand. Specifically, the fourth ligand is bonded to the surface of the quantum dot through the fourth active group to form the first quantum dots with the fourth ligand bonded to the surface.

In the step of performing the ligand exchange reaction under the fourth heating condition, the reaction temperature of the fourth heating condition is in the range of 60° C.~90° C., the reaction time of the ligand exchange reaction is in the range of 4 h~8 h. In the ligand exchange reaction step performed under the first heating condition, the reaction temperature of the first heating condition is in the range of 100° C. to 200° C., and the reaction time of the ligand exchange reaction is in the range of 8 h to 16 h. If the reaction temperature of the fourth heating condition is too low or the reaction time is too short, it is difficult to effectively exchange the surface ligands of the initial quantum dots, and even the ligand exchange reaction fails to occur effectively. If the reaction temperature of the fourth heating condition is too high or the reaction time is too long, on one hand, the hetero-side reactions are likely to occur, which affects the effect of quantum dot ligand exchange, and introduces difficult-to-remove impurities in the quantum dot; on the other hand, the excessively high temperature will reduce the activity of the exchange reaction and affect the effect of ligand exchange.

In addition, the excessively high temperature is likely to cause the volatilization of fatty acids, which is not conducive to the contact between the fourth ligand with the initial quantum dots, and increases the difficulty for the ligand exchange to occur between the initial quantum dots and the fourth ligand.

For S014, references can be made to the description of S01 above, and detailed description thereof is omitted herein.

In step S015, the mixed solution including the initiator and the cross-linking agent is added to the second quantum dots, and the first ligand on the surface of the second quantum dots is polymerized through heating. In some embodiments, the mixed solution including the initiator and the cross-linking agent initiates at least one selected from the group including azobisisobutyronitrile (AIB) and benzoyl peroxide. In some embodiments, in the mixed solution including the initiator and the cross-linking agent, the cross-linking agent is selected from at least one of ethylene glycol dimethacrylate (EGDMA) or divinylbenzene. In some embodiments, based on the total weight of the mixed solution of the initiator and the cross-linking agent being 100%, the total initiator content is in the range of 1% to 5%, and the cross-linking agent content is in the range of 1% to 5% by weight.

In some embodiments, the step of heating to crosslink the fourth ligand on the surface of the second quantum dots is performed at the reaction temperature in the range of 60° C. to 90° C. for the reaction time in the range of 24 h to 48 h. Under this condition, the fourth ligand can be effectively polymerized without affecting other properties of the obtained quantum dot film. In addition, under this condition, it is equivalent to annealing the quantum dot prefabricated film. In this process, the fourth ligand on the surface of the quantum dots of the quantum dot film polymerizes to form the chain-shaped polymer, and the quantum dots are arranged in an orderly manner. The ligands are tightly connected to form a preferred orientation, which provides the basic framework for the crystallization of the quantum dot film. In addition, due to the shortening of the distance between the quantum dots, the charge transport between the quantum dots in different layers and the charge transport of the quantum dots within the same layers are both enhanced, and the conductivity is enhanced.

On the basis of the above three embodiments, in some embodiments, after the step of carrying out the ligand exchange reaction under the first heating condition, the method further includes: dispersing the obtained reaction system in a polar solvent, and collecting quantum dot precipitation; and dissolving the obtained quantum dots in a non-polar solvent and repeating at least once. In this case, the second quantum dots are precipitated by a polar solvent and collected by centrifugation. The collected second quantum dots are dispersed in a non-polar solvent to form a second quantum dots solution. The process is repeated several times to obtain the high-purity second quantum dots.

In the fourth embodiment, the preparation method further includes the following processes.

The second quantum dots with the first ligand bonded to the surface is mixed with the fatty acid solution of the second ligand, and the ligand exchange reaction is performed under the second heating condition to prepare the third quantum dot with the first ligand and the second ligand bonded to the surface at the same time.

The second ligand is a compound with at least two or more benzene rings, and the second ligand contains a second active group bonded to the quantum dot particles. A reactivity between the second active group and the quantum dot is less than a reactivity between the first active group and the quantum dot. In this case, when the quantum dot material is used as the light-emitting layer material of the quantum dot light-emitting diode, the second ligand has a strong affinity for the hole transport layer, and the non-polar end of the polybenzene ring structure is a positively charged end. The positively charged end is coupled with the positive potential on the surface of the hole transport layer to enhance the hole conductivity at the interface between the quantum dot light-emitting layer and the hole transport layer. At the same time, the second ligand helps to reduce the contact angle between the quantum dot and the hole transport layer, and makes the spreadability of the quantum dots desirable when the film is formed by the solution processing method, thereby improving the uniformity of the film thickness after the film is formed.

The first ligand and the DEL ligand coexist between the quantum dot particles, resulting in the hyperconjugation resonance. The hyperconjugation resonance substantially enhances the intracrystalline conductivity of the superlattice structure formed by the quantum dot layer, increases the carrier mobility of the quantum dot film, improves the luminous efficiency of the quantum dot light-emitting device, reduces the charge accumulation at the interface between the transport layer and the quantum dot layer, and extends the lifespan of the quantum dot light-emitting device.

In some embodiments, the second active group is selected from one of a hydroxyl group, a carboxyl group, a mercapto group, and an amino group.

In some embodiments, the second ligand is selected from at least one of a fused ring with a benzene ring number of 2-6, biphenyl, or a hyperconjugated structure containing —Ar—C═C—Ar—, where Ar is a benzene ring.

In some embodiments, the second ligand is selected from at least one of the following Formula 2, Formula 3, or Formula 4, where $X^4$, $X^5$, and $X^6$ are the same or different second active groups, n and l is positive integers from 1 to 5.

Formula 2

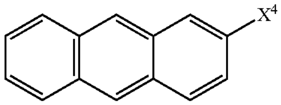

Formula 3

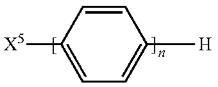

Formula 4

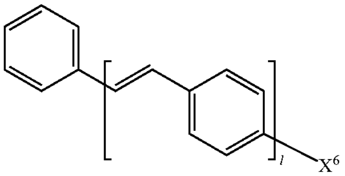

In some embodiments, the second ligand is selected from at least one of 2-aminoanthracene, biphenylmonoacetic acid, 4,4-stilbene dicarboxylic acid, biphenylmonoacetic acid, or 4,4-stilbene dicarboxylic acid.

Figure 4:
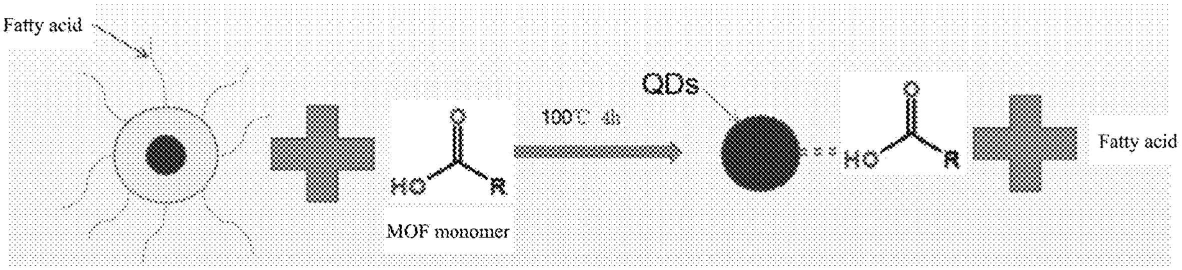
FIG. 4 is a schematic diagram of an exemplary ligand exchange reaction on surfaces of first quantum dots according to some embodiments of the present disclosure.
Figure 5:
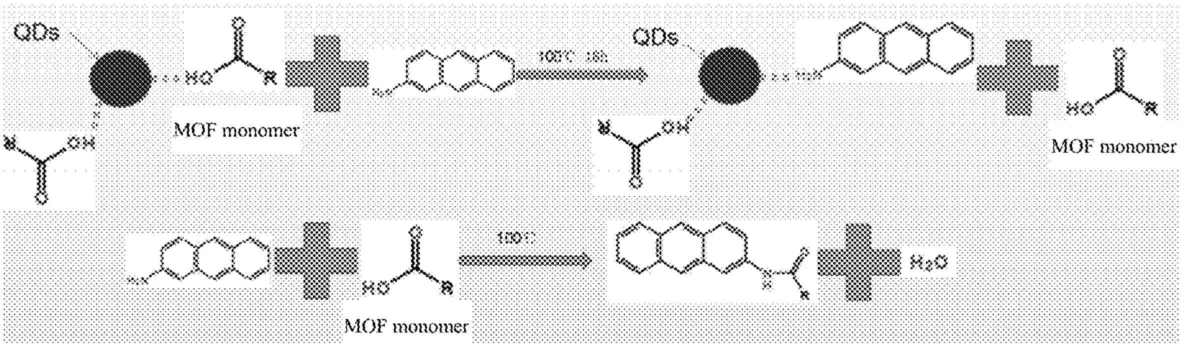
FIG. 5 is a schematic diagram of another exemplary ligand exchange reaction on the surfaces of the first quantum dots according to some embodiments of the present disclosure.

In some embodiments, 1,3,5-tris(4-carboxyphenyl)benzene is used as the first ligand, and 2-aminoanthracene is used as the second ligand. In this case, as shown in FIG. 4, 1,3,5-tris(4-carboxyphenyl)benzene and the initial ligand on the surface of the first quantum dots, such as oleic acid, undergo a ligand exchange reaction to obtain the first quantum dots with 1,3,5-tris(4-carboxyphenyl)benzene bonded to the surface. As shown in FIG. 5, the ligand exchange is performed between 2-aminoanthracene and the first quantum dots bonded to 1,3,5-tris(4-carboxyphenyl) benzene. The exchanged 1,3,5-tris(4-carboxyphenyl)benzene will amidate with the free 2-aminoanthracene in the solution and produce water at the same time. The side reaction promotes the ligand exchange and consumes 1,3,5-tris(4-carboxyphenyl)benzene produced by the ligand exchange reaction.

In some embodiments, mixing the second quantum dots with the first ligand bonded to the surface and the fatty acid solution of the second ligand includes: separately configuring the second quantum dots solution with the first ligand bonded to the surface and the fatty acid solution of the second ligand, and adding the fatty acid solution of the second ligand to the second quantum dots solution with the first ligand bonded to the surface. The second quantum dots solution is obtained by dispersing the second quantum dots in a non-polar solvent. The use of the non-polar solvent improves the dispersibility of the second quantum dots, and prevents the second quantum dots from agglomeration and precipitation in the polar solvent, which affects the ligand exchange on the surface of the quantum dots.

In the fatty acid solution of the second ligand, the fatty acid acts as the solvent of the second ligand, which provides a good dissolution state for the second ligand to participate in the ligand exchange reaction. More importantly, since the second quantum dots solution uses the non-polar solvent, the addition of fatty acid can improve the infiltration and penetration of the second ligand in the second quantum dots solution to enhance the affinity and solubility of the second ligand to the second quantum dots solution, so as to promote the ligand exchange reaction. In some embodiments, the fatty acid in the fatty acid solution of the second ligand is selected from at least one of n-octanoic acid, acetic acid, n-hexanoic acid, n-butyric acid, or n-valeric acid.

In some embodiments, in the step of mixing the second quantum dots with the first ligand bonded to the surface and the fatty acid solution of the second ligand, the second quantum dots and the second ligand are mixed according to the molar ratio of the second ligand to the second quantum dots in the range of 1:1~10:1. In this case, by controlling the content of the second ligand, the degree to which the second ligand replaces the first ligand on the second quantum dots can be controlled, so that the content of the first ligand and second ligand in the obtained quantum dot material is appropriate, for example, about 1:1, thereby taking advantage of a synergistic effect of the two.

In some embodiments, in the step of performing the ligand exchange reaction under the first heating condition, the reaction temperature of the first heating condition is in the range of 100° C. to 200° C., and the reaction time of the ligand exchange reaction is in the range of 4 h to 8 h. In the step of performing the ligand exchange reaction under the second heating condition, the reaction temperature is in the range of 100° C. to 150° C., and the reaction time is in the range of 8 h to 16 h. If the reaction temperature of the second heating condition is too low or the reaction time is too short, it is difficult to undergo a substitution reaction with the first ligand on the surface of the second quantum dot. If the reaction temperature of the second heating condition is too high or the reaction time is too long, on one hand, the hetero-side reactions are likely to occur, which affects the effect of quantum dot ligand exchange, and introduces difficult-to-remove impurities in the quantum dot; on the other hand, the excessively high temperature will reduce the activity of the exchange reaction and affect the effect of the ligand exchange.

In addition, the excessively high temperature is likely to cause the volatilization of fatty acids, which is not conducive to the contact between the compound A and the initial quantum dots, and increases the difficulty for the ligand exchange to occur between the initial quantum dots and compound A.

In addition to the foregoing examples of the fourth embodiment, in some examples, after performing the ligand exchange reaction under the second heating condition, the method further includes: dispersing the obtained reaction system in a polar solvent and collecting the third quantum dot precipitation; dissolving the obtained third quantum dot in the non-polar solvent and repeating at least once to collect the third quantum dot; and providing the third quantum dot solution, and adding the second ligand to the third quantum dot solution.

In addition to the foregoing examples of the fourth embodiment, in some examples, in the step of adding the second ligand to the third quantum dot solution, the molar ratio of the second ligand to the quantum dot is not higher than 1:2. At this time, in the MOF monomer, the first active group released by the second ligand can bind to the second ligand and undergo an amidation reaction, to cause the MOF monomer to undergo a ring expansion reaction, thereby improving a super conjugation effect of the quantum dot material.

It is worth noting that, in the embodiments of the present disclosure, the non-polar solvent used in various processes may be, but is not limited to, any one of n-hexane, n-octane, and chlorobenzene. The polar solvent may be, but is not limited to, any one of anhydrous ethanol, ethyl acetate, acetone, chloroform, and methanol.

It is worth noting that, in the embodiments of the present disclosure, the active groups of the ligands used in the preceding ligand exchange process are less polar than the active groups of the ligands used in the succeeding ligand exchange process. Specifically, the polarity of the second active group is weaker than the polarity of the first active group. The polarity of the third active group is weaker than the polarity of the first active group. The polarity of the fourth active group is stronger the polarity of the first active group.

Figure 6:
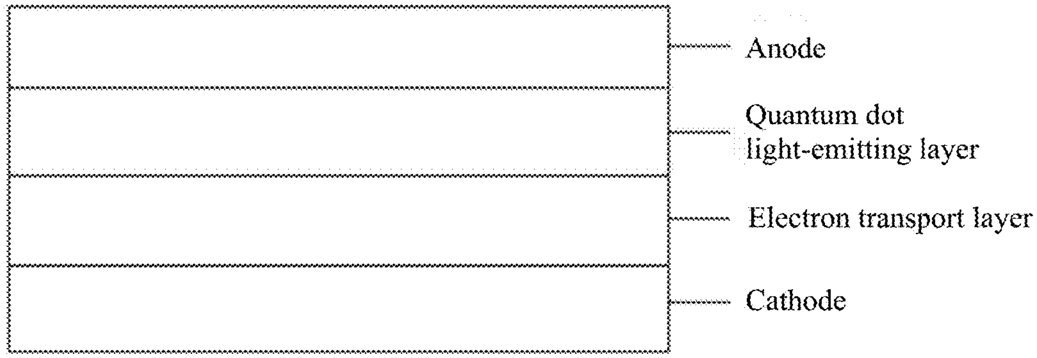
FIG. 6 is a schematic structural diagram of a quantum dot light-emitting diode according to some embodiments of the present disclosure.

As shown in FIG. 6, the third aspect of the embodiments of the present disclosure provides a quantum dot light-emitting diode. The quantum dot light-emitting diode includes an anode and a cathode arranged oppositely, a quantum dot light-emitting layer arranged between the cathode and the anode, and an electron transport layer disposed between the quantum dot light-emitting layer and the cathode. The material of the quantum dot light-emitting layer is the aforementioned quantum dot material; or the material of the quantum dot light-emitting layer is the quantum dot material prepared by the aforementioned preparation method.

In the quantum dot light-emitting diode provided by the embodiments of the present application, the quantum dot light-emitting layer adopts the above-described quantum dot material. Therefore, the carrier transport capacity is improved, the electrical conductivity of the quantum dot film is improved, the internal recombination ability of the excitons in the light-emitting layer is improved, the charge accumulation at the interface between the quantum dot light-emitting layer and the electron transport layer is reduced, and the lifespan and luminous efficiency of the quantum dot light-emitting device are improved.

In some embodiments, the quantum dot light emitting diode further includes a hole function layer disposed between the anode and the quantum dot light emitting layer. The hole function layer includes at least one of a hole injection layer or a hole transport layer.

In some embodiments, the quantum dot light emitting diode further includes an electron injection layer disposed between the cathode and the electron transport layer.

The fourth aspect of the embodiments of the present disclosure provides a method for fabricating a quantum dot light-emitting diode. The method for fabricating the quantum dot light-emitting diode at least includes: providing a prefabricated device, depositing quantum dots on the prefabricated device, and preparing a quantum dot light-emitting layer. The material of the quantum dots is the above-described quantum dot material; or the material of the quantum dot light-emitting layer is the quantum dot material prepared by the above-mentioned preparation method.

The method for preparing the quantum dot light-emitting diode provided in the embodiments of the present disclosure only needs to prepare a quantum dot film basically according to a conventional method to realize the preparation of the quantum dot light-emitting layer with the first ligand bonded to the surface. The method is simple and controllable. It is easy to achieve industrialization. It is important that the quantum dot light-emitting diode prepared by the method can improve the carrier transport capacity and the conductivity of the quantum dot film. Thus, the ability of excitons to recombine in the light-emitting layer is enhanced, the interaction between the quantum dot light-emitting layer and the quantum dot film is reduced, the accumulation of charge at the interface between the light-emitting layer and the electron transport layer is reduced, and the lifespan and luminous efficiency of the quantum dot light-emitting device are improved.

In the embodiment of the present disclosure, the prefabricated device is divided into two scenarios.

In the first scenario, the prefabricated device includes at least one anode. In some embodiments, the prefabricated device is an anode substrate. In some other embodiments, the prefabricated device may also be a laminated prefabricated device in which the anode is provided on the substrate and the hole transport layer is provided on the surface of the anode. In some other embodiments, the prefabricated device may also be a laminated prefabricated device with the anode on the substrate, the hole injection layer on the surface of the anode, and the hole transport layer on the surface of the hole injection layer facing away from the anode. It should be understood that the present disclosure is not limit to the structures of the above-mentioned embodiments.

In addition, after the quantum dot material is deposited according to the above-mentioned method to prepare the quantum dot light-emitting layer, the method further includes: preparing the electron transport layer on the quantum dot light-emitting layer and preparing the cathode on the electron transport layer. In some embodiments, before preparing the cathode, the method further includes: preparing the electron injection layer on the electron transport layer.

In the second scenario, the prefabricated device includes the cathode and the electron transport layer on the cathode. In some embodiments, the prefabricated device is a laminated prefabricated device in which the cathode is arranged on a substrate and the electron transport layer is arranged on the surface of the cathode. In some embodiments, the prefabricated device may also be a laminated prefabricated device with the cathode on the substrate, the electron injection layer on the surface of the cathode, and the electron transport layer on the surface of the electron injection layer facing away from the cathode.

On the basis of this embodiment, after the quantum dot material is deposited according to the method described in the present disclosure to prepare the quantum dot light-emitting layer, the method further includes: preparing the anode on the quantum dot light-emitting layer. In some embodiments, before preparing the cathode, the method further includes: preparing the hole transport layer on the quantum dot light-emitting layer. In some embodiments, before preparing the cathode, the method further includes: preparing the hole transport layer on the quantum dot light-emitting layer, and preparing the hole injection layer on the hole transport layer.

On the basis of the foregoing embodiment, before the step of depositing quantum dots on the prefabricated device, the method further includes: depositing the first ligand solution on the prefabricated device to form a first ligand thin film between the prefabricated device and the formed quantum dot light-emitting layer. The first ligand solution provides nucleation sites for the formation of quantum dot superlattices, at the same time can fill the quantum dots to replace the ligands lost and shed in the film formation process due to solvent evaporation and other reasons, and can be connected to surface suspension elements of the quantum dots in a solution state, which cannot be connected due to a site resistance effect, thereby functioning as a 3D orderly arranged structure similar to the MOF. In some embodiments, after depositing the first ligand solution on the prefabricated device, the method further includes: heating to a temperature in the range of 70° C. to 90° C. for about 10 min to 30 min to obtain the first ligand film.

The description will be given below in conjunction with specific embodiments.

Example 1

The method for preparing quantum dots includes the following processes.

At room temperature, in the inert gas atmosphere, a mixture of 1,3,5-tris(4-carboxyphenyl)benzene and n-octanoic acid is added to the non-polar solvent of the CdZnSe/ZnSe quantum dots. After the temperature is raised to 150° C., the ligand exchange reaction is performed for 30 minutes to obtain a quantum dot solution of 1,3,5-tris(4-carboxyphenyl)benzene. After the ligand exchange reaction is over, a product of the ligand exchange reaction is repeatedly dissolved, precipitated and centrifuged with n-hexane and ethanol for multiple times to obtain a CdZnSe/ZnSe quantum dot product dispersed in n-octane.

Example 2

The method for preparing quantum dots includes the following processes.

1,3,5-tris(4-carboxyphenyl)benzene and n-octanoic acid are added to the non-polar solvent of CdZnSe/ZnSe/ZnS quantum dots at room temperature in the inert gas atmosphere. After the temperature is raised to 120° C., the ligand exchange reaction is performed for 35 minutes to obtain the quantum dot solution of 1,3,5-tris(4-carboxyphenyl)benzene. After the ligand exchange reaction is over, the product is repeatedly dissolved, precipitated and centrifuged with n-hexane and ethanol for multiple times to obtain the CdZnSe/ZnSe/ZnS quantum dot product dispersed in n-octane.

Example 3

The method for preparing the quantum dot using 1,3,5-tris(4-carboxylate) includes the following processes.

CdZnSeS/ZnSe/ZnS quantum dot film is prepared with 1,3,5-tris(4-carboxyphenyl)benzene as the substrate or ligand.

1,3,5-tris(4-carboxyphenyl)benzene and n-octanoic acid are added to the non-polar solvent of CdZnSeS/ZnSe/ZnS quantum dots at room temperature in the inert gas atmosphere. After the temperature is raised to 180° C., the ligand exchange reaction is performed for 25 minutes to obtain the quantum dot solution of 1,3,5-tris(4-carboxyphenyl)benzene. After the reaction is over, the product is repeatedly dissolved, precipitated and centrifuged with n-hexane and ethanol for multiple times to obtain the CdZnSeS/ZnSe/ZnS quantum dot product dispersed in n-octane.

Example 4

The method for preparing quantum dots includes the following processes.

At room temperature, in the inert gas atmosphere, a mixture of 1,3,5-tris(4-carboxyphenyl)benzene and n-octanoic acid is added to the non-polar solvent of the CdZnSeS/ZnS quantum dots. After the temperature is raised to 100° C., the ligand exchange reaction is performed for 20-40 minutes to obtain the quantum dot solution of 1,3,5-tris(4-carboxyphenyl)benzene. After the reaction is over, the product is repeatedly dissolved, precipitated and centrifuged with n-hexane and ethanol for multiple times to obtain the CdZnSeS/ZnS quantum dot product dispersed in n-octane.

Comparative Example 1

The preparation method is the same as in Example 1, except that oleic acid is used as the ligand.

Comparative Example 2

The preparation method is the same as in Example 2, except that oleic acid is used as the ligand.

Comparative Example 3

The preparation method is the same as in Example 3, except that oleic acid is used as the ligand.

Comparative Example 4

The preparation method is the same as in Example 4, except that oleic acid is used as the ligand.

Using the quantum dots of the examples 1~4 and the comparative examples 1~4 as the material of the quantum dot light-emitting layer in the quantum dot light-emitting diode, the method for preparing the quantum dot light-emitting diode includes the following processes.

An anode substrate is provided.

Before spin-coating the quantum dots, a layer of an ethanol solution with a weight percentage of 1% (example 1, comparative example 1), 2% (example 2, comparative example 2), 3% (example 3, comparative example 3), 2.5% (example 4, comparative example 4) of 1,3,5-tris(4-carboxyphenyl)benzene is spin-coated on the substrate to obtain a layer of 1,3,5-tris(4-carboxyphenyl)benzene film.

The quantum dot solutions of examples 1~4 and comparative examples 1~4 are deposited on the 1,3,5-tris(4-carboxyphenyl)benzene film, which is dried to obtain the quantum dot light-emitting layer.

A nano-zinc oxide electron transport layer is deposited on the quantum dot light-emitting layer and annealed. An aluminum electrode is vapor-deposited, and an electronic glue is used for packaging to obtain the quantum dot light-emitting diode.

The quantum dot light-emitting diode prepared by using the quantum dots of examples 1~4 and comparative examples 1 to 4 are tested for lifespan performance. The test method includes the following processes. When the quantum dot light-emitting diode device is driven by a constant current or voltage, the brightness of the device is reduced to a certain percentage of the highest brightness of the device. A time for the brightness of the device to drop to 95% of the highest brightness of the device is defined as T95, and the time is measured as the lifespan of the device. In order to shorten a test cycle, the device lifespan test is usually carried out by accelerating aging of the device with reference to the OLED device test at a high brightness, and a decay fitting formula of an extended exponential decay brightness is used to fit the lifespan of the device under the high brightness. For example, the lifespan of the device under 1000 nit is counted as T951000 nit. The specific calculation formula is as follows:

$$T95_L = T95_H \cdot \left(\frac{L_H}{L_L}\right)^A$$

where, $T95_L$ is the lifespan under a low brightness, $T95_H$ is the measured lifespan under a high brightness, LH is an acceleration of the device to the highest brightness, LL is 1000 nit, and A is an acceleration factor. For an OLED device, a value of A is in the range of 1.6~2. By measuring the lifespan of several groups of green QLED devices at rated brightness in this experiment, the value of A is determined to be about 1.7.

A lifespan test system is used to carry out the lifespan test on corresponding devices, and the test conditions are: at room temperature, and the air humidity is in the range of 30%~60%. The test results are shown in Table 1 below.

TABLE 1

| | Comp. example 1 | Example 1 | Comp. example 2 | Example 2 | Comp. example 3 | Example 3 | Comp. example 4 | Example 4 |
|---|---|---|---|---|---|---|---|---|
| T95 (h) | 1.15 | 2.15 | 0.89 | 1.87 | 0.61 | 1.32 | 0.48 | 1.65 |

Example 5

The method for preparing quantum dots includes the following processes.

A mixture of 1,3,5-tris(4-carboxyphenyl) and n-octanoic acid is added to the non-polar solution of CdZnSe/ZnSe quantum dots with oleic acid as the ligand in the inert gas atmosphere at room temperature. The ligand is the first ligand, and the molar ratio of the first ligand to the quantum dot is about 50:1. After the temperature is raised to 100° C., the ligand exchange reaction is performed for 8 hours to obtain the quantum dot solution with 1,3,5-tris(4-carboxyphenyl)benzene as the ligand. The quantum dot solution is repeatedly dissolved, precipitated and centrifuged through n-hexane and ethanol for multiple times to obtain the quantum dot product dispersed in n-octane as the first quantum dots solution.

At room temperature and in the inert gas atmosphere, a mixture of 2-aminoanthracene (the second ligand) and n-octanoic acid is added to the non-polar solvent of the quantum dots, and the molar ratio of the injected second ligand to the quantum dots is about 5:1. After the temperature is raised to 100° C., the ligand exchange reaction is performed for 16 hours to obtain the second quantum dots solution with 2-aminoanthracene and 1,3,5-tris(4-carboxyphenyl)benzene as the ligands. The ratio of the two ligands on the quantum dots is approximately 1:1. After the reaction is over, the product is repeatedly dissolved, precipitated and centrifuged with n-hexane and ethanol for multiple times to obtain the quantum dot product dispersed in n-octane. A small amount of 2-aminoanthracene is added to the quantum dot product. The molar ratio of 2-aminoanthracene to the quantum dots is about 1:2.

Example 6

The method for preparing quantum dots includes the following processes.

A mixture of 1,3,5-tris(4-carboxyphenyl) and n-octanoic acid is added to the non-polar solution of CdZnSe/ZnSe/ZnS quantum dots with oleic acid as the ligand in the inert gas atmosphere at room temperature. The ligand is the first ligand, and the molar ratio of the added amount to the quantum dots is about 50:1. After the temperature is raised to 100° C., the ligand exchange reaction is performed for 8 hours to obtain the quantum dot solution with 1,3,5-tris(4-carboxyphenyl)benzene as the ligand. The quantum dot solution is repeatedly dissolved, precipitated and centrifuged through n-hexane and ethanol for multiple times to obtain the quantum dot product dispersed in n-octane as the first quantum dots solution.

At room temperature and in the inert gas atmosphere, a mixture of 2-naphthylamine and n-octanoic acid is added to the non-polar solvent of the first quantum dots, and the molar ratio of the injected second ligand to the quantum dots is about 5:1. After the temperature is raised to 100° C., the ligand exchange reaction is performed for 16 hours to obtain the second quantum dots solution with 2-naphthylamine and 1,3,5-tris(4-carboxyphenyl)benzene as the ligands. The ratio of the two ligands on the quantum dots is approximately 1:1. After the reaction is over, the product is repeatedly dissolved, precipitated and centrifuged in n-hexane and ethanol for multiple times to obtain the quantum dot product dispersed in n-octane. A small amount of 2-naphthylamine is added to the quantum dot product. The molar ratio of the added amount to the quantum dots is about 1:2.

Example 7

The method for preparing quantum dots includes the following processes.

1,3,5-tris(4-carboxyphenyl) and n-octanoic acid are added to the non-polar solution of CdZnSeS/ZnSe/ZnS quantum dots with oleic acid as the ligand in the inert gas atmosphere at room temperature. The ligand is the first ligand, and the molar ratio of the added amount to the quantum dots is about 50:1. After the temperature is raised to 100° C., the ligand exchange reaction is performed for 8 hours to obtain the quantum dot solution with 1,3,5-tris(4-carboxyphenyl)benzene as the ligand. The quantum dot solution is repeatedly dissolved, precipitated and centrifuged through n-hexane and ethanol for multiple times to obtain the quantum dot product dispersed in n-octane as the first quantum dots solution.

At room temperature, in the inert gas atmosphere, a mixture of 1,1',4',1"-terphenyl-4-thiol and n-octanoic acid is added to the non-polar solvent of the first quantum dot. The molar ratio of the injected second ligand to the quantum dots is about 5:1. After the temperature is raised to 100° C., the ligand exchange reaction is performed for 16 h to obtain the second quantum dots solution with the 2-aminoanthracene 1,1',4',1"-terphenyl-4-thiol and 1,3,5-Tris(4-carboxyphenyl) benzene as the ligands. The ratio of the two ligands on the obtained quantum dots is about 1:1.

After the reaction is over, the product is repeatedly dissolved, precipitated and centrifuged with n-hexane and ethanol for multiple times to obtain the quantum dot product dispersed in n-octane. A small amount of 1,1',4',1"-terphenyl-4-thiol is added to the quantum dot product. The molar ratio of the added amount to the quantum dots is about 1:2. The structure of 1,1',4',1"-terphenyl-4-thiol is:

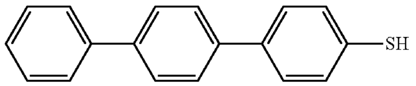 [SMILES: Sc1ccc(-c2ccc(-c3ccccc3)cc2)cc1]

Example 8

The method for preparing quantum dots includes the following processes.

1,3,5-tris(4-carboxyphenyl) and n-octanoic acid are added to the non-polar solution of CdZnSeS/ZnS quantum dots with oleic acid as the ligand in the inert gas atmosphere at room temperature. The ligand It is the first ligand, and the molar ratio of the added amount to the quantum dots is about 50:1. After the temperature is raised to 100° C., the ligand exchange reaction is performed for 8 hours to obtain the quantum dot solution with 1,3,5-tris(4-carboxyphenyl)benzene as the ligand. The quantum dot solution is repeatedly dissolved, precipitated and centrifuged through n-hexane and ethanol for multiple times to obtain the quantum dot product dispersed in n-octane as the first quantum dots solution.

At room temperature and in the inert gas atmosphere, a mixture of 4-amino-P-terphenyl and n-octanoic acid is added to the non-polar solvent of the quantum dots, and the molar ratio of the injected second ligand to the quantum dots is about 5:1. After the temperature is raised to 100° C., the ligand exchange reaction is performed for 16 hours to obtain the second quantum dots solution with 4-amino-P-terphenyl and 1,3,5-tris(4-carboxyphenyl)benzene as the ligands. The ratio of the two ligands on the obtained quantum dots is approximately 1:1.

After the reaction is over, the product is repeatedly dissolved, precipitated and centrifuged with n-hexane and ethanol for multiple times to obtain the quantum dot product dispersed in n-octane. A small amount of 4-amino-P-terphenyl is added to quantum dot product. The molar ratio of the added amount to the quantum dots is about 1:2. The structure of 4-amino-P-terphenyl is:

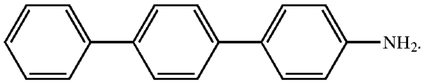 [SMILES: Nc1ccc(-c2ccc(-c3ccccc3)cc2)cc1]

Using the quantum dots of examples 5-8 as the material of the quantum dot light-emitting layer in the quantum dot light-emitting diode, the method for preparing the quantum dot light-emitting diode includes the following processes.

An anode substrate is provided.

The quantum dot solution prepared in examples 5-8 is deposited on the anode substrate, and the anode substrate is dried to obtain the quantum dot light-emitting layer with hyperconjugation effect and enhanced conjugation resonance.

A nano-zinc oxide electron transport layer is deposited on the quantum dot light-emitting layer and an annealing treatment is performed.

The aluminum electrode is vapor-deposited, and the electronic glue is used for packaging to obtain the quantum dot light-emitting diode.

The quantum dot light-emitting diode prepared by using the quantum dots of examples 5-8 as the quantum dot light-emitting layer is tested for lifespan performance. The test method includes the following processes. When the quantum dot light-emitting diode device is driven by a constant current or voltage, the brightness of the device is reduced to a certain percentage of the highest brightness of the device. A time for the brightness of the device to drop to 95% of the highest brightness of the device is defined as T95, and the time is measured as the lifespan of the device. In order to shorten the test cycle, the device lifespan test is usually carried out by accelerating the aging of the device with reference to the OLED device test at a high brightness, and the decay fitting formula of the extended exponential decay brightness is used to fit the lifespan under the high brightness. For example, the lifespan of the device under 1000 nit is counted as T951000 nit. The specific calculation formula is as follows:

$$T95_L = T95_H \cdot \left(\frac{L_H}{L_L}\right)^A$$

where, $T95_L$ is the lifespan under a low brightness, $T95_H$ is the measured lifespan under a high brightness, LH is an acceleration of the device to the highest brightness, LL is 1000 nit, and A is an acceleration factor. For an OLED device, a value of A is in the range of 1.6~2. By measuring the lifespan of several groups of green QLED devices at rated brightness in this experiment, the value of A is determined to be about 1.7.

A lifespan test system is used to carry out the lifespan test on the corresponding devices, and the test conditions are: at room temperature, and the air humidity is in the range of 30%~60%. The test results are shown in Table 2 below.

TABLE 2

| | Example 5 | Example 6 | Example 7 | Example 8 |
|---|---|---|---|---|
| T95(h) | 2.23 | 1.90 | 1.29 | 1.69 |

Example 9

The method for preparing quantum dots includes the following processes.

At room temperature, in the inert gas atmosphere, a mixture of monomethyl suberate and n-octanoic acid is added to a non-polar solvent of CdZnSe/ZnSe quantum dots. After the temperature is raised to 100° C., the ligand exchange reaction is performed for 1 hour to obtain the first quantum dots solution with suberic acid as the ligand. A small amount of a mixture of fatty acids and ethanol is added to the first quantum dots solution, and the first quantum dots solution is hydrolyzed at 100° C. for 4 hours to obtain the second quantum dots solution with suberic acid as the ligand. 1,3,5-tris(4-carboxyphenyl)benzene fatty acid mixture is added to the second quantum dots solution in the inert gas atmosphere at room temperature. After the temperature is raised to 100° C., the ligand exchange reaction is performed for 16 hours to obtain the third quantum dot solution with 1,3,5-tris(4-carboxyphenyl)benzene and suberic acid as the ligands. The molar ratio of 1,3,5-tris(4-carboxyphenyl) benzene to the quantum dots is about 1:1. After the reaction is over, the product is repeatedly dissolved, precipitated and centrifuged with n-hexane and ethanol for multiple times to obtain the quantum dot product dispersed in n-octane.

Example 10

The method for preparing quantum dots includes the following processes.

At room temperature, in the inert gas atmosphere, a mixture of monomethyl adipate and n-octanoic acid is added to a non-polar solvent of CdZnSe/ZnSe/ZnS quantum dots. After the temperature is raised to 100° C., the ligand exchange reaction is performed for 1 hour to obtain the first quantum dots solution with adipic acid as the ligand. A small amount of a mixture of fatty acids and ethanol is added to the first quantum dots solution, and the first quantum dots solution is hydrolyzed at 100° C. for 4 hours to obtain the second quantum dots solution with suberic acid as the ligand. 1,3,5-tris(4-carboxyphenyl)benzene fatty acid mixture is added to the second quantum dots solution in the inert gas atmosphere at room temperature. After the temperature is raised to 100° C., the ligand exchange reaction is performed for 16 hours to obtain the third quantum dot solution with 1,3,5-tris(4-carboxyphenyl)benzene and adipic acid as the ligands. The molar ratio of 1,3,5-tris(4-carboxyphenyl) benzene to the quantum dots is about 1:1. After the reaction is over, the product is repeatedly dissolved, precipitated and centrifuged with n-hexane and ethanol for multiple times to obtain the quantum dot product dispersed in n-octane.

Example 11

The method for preparing quantum dots includes the following processes.

At room temperature, in the inert gas atmosphere, a mixture of monomethyl glutarate and n-octanoic acid is added a non-polar solvent of CdZnSeS/ZnSe/ZnS quantum dots. After the temperature is raised to 100° C., the ligand exchange reaction is performed for 1 hour to obtain the first quantum dots solution with suberic acid as the ligand. A small amount of a mixture of fatty acids and ethanol is added to first quantum dots solution, and the first quantum dots solution is hydrolyzed at 100° C. for 4 hours to obtain the second quantum dots solution with glutaric acid as the ligand. 1,3,5-tris(4-carboxyphenyl)benzene fatty acid mixture is added to the second quantum dots solution in the inert gas atmosphere at room temperature. After the temperature is raised to 100° C., the ligand exchange reaction is performed for 16 hours to obtain the third quantum dot solution with 1,3,5-tris(4-carboxyphenyl)benzene and glutaric acid as the ligands. The molar ratio of 1,3,5-tris(4-carboxyphenyl)benzene to the quantum dots is about 1:1. After the reaction is over, the product is repeatedly dissolved, precipitated and centrifuged with n-hexane and ethanol for multiple times to obtain the quantum dot product dispersed in n-octane.

Example 12

The method for preparing quantum dots includes the following processes.

At room temperature, in the inert gas atmosphere, a mixture of monomethyl sebacate and n-octanoic acid is added to a non-polar solvent of CdZnSe/ZnSe quantum dots. After the temperature is raised to 100° C., the ligand exchange reaction is performed for 1 hour to obtain the first quantum dots solution with sebacic acid as the ligand. A small amount of a mixture of fatty acids and ethanol is added to the first quantum dots solution, and the first quantum dots solution is hydrolyzed at 100° C. for 4 hours to obtain the second quantum dots solution with sebacic acid as the ligand. 1,3,5-tris(4-carboxyphenyl)benzene fatty acid mixture is added to the second quantum dots solution in the inert gas atmosphere at room temperature. After the temperature is raised to 100° C., the ligand exchange reaction is performed for 16 hours to obtain the third quantum dot solution with 1,3,5-tris(4-carboxyphenyl)benzene and sebacic acid as the ligands. The molar ratio of 1,3,5-tris(4-carboxyphenyl) benzene to the quantum dots is about 1:1. After the reaction is over, the product is repeatedly dissolved, precipitated and centrifuged with n-hexane and ethanol for multiple times to obtain the quantum dot product dispersed in n-octane.

The quantum dots of examples 9-12 are used as the quantum dot light-emitting layer material in the quantum dot light-emitting diode, and the method for preparing the quantum dot light-emitting diode includes the following processes.

An anode substrate is provided and a hole transport layer is prepared on an anode prefabricated device, The quantum dot solution prepared in examples 9-12 is deposited on the hole transport layer, and the hole transport layer is dried to prepare the quantum dot light-emitting layer.

A nano-zinc oxide electron transport layer is deposited on the quantum dot light-emitting layer and an annealing treatment is performed.

An aluminum electrode is vapor-deposited, and an electronic glue is used for packaging to obtain the quantum dot light-emitting diode.

The quantum dot light-emitting diode prepared by using the quantum dots of examples 9-12 as the quantum dot light-emitting layer is tested for its lifespan performance. The test method includes the following processes. When the quantum dot light-emitting diode device is driven by a constant current or voltage, the brightness of the device is reduced to a certain percentage of the highest brightness of the device. A time for the brightness of the device to drop to 95% of the highest brightness of the device is defined as T95, and the time is measured as the lifespan of the device. In order to shorten the test cycle, the device lifespan test is usually carried out by accelerating the aging of the device with reference to the OLED device test at a high brightness, and the decay fitting formula of the extended exponential decay brightness is used to fit the lifespan under the high brightness. For example, the lifespan of the device under 1000 nit is counted as T951000 nit. The specific calculation formula is as follows:

$$T95_L = T95_H \cdot \left(\frac{L_H}{L_L}\right)^A$$

where, $T95_L$ is the lifespan under a low brightness, $T95_H$ is the measured lifespan under a high brightness, LH is an acceleration of the device to the highest brightness, LL is 1000 nit, and A is an acceleration factor. For an OLED device, a value of A is in the range of 1.6~2. By measuring the lifespan of several groups of green QLED devices at rated brightness in this experiment, the value of A is determined to be about 1.7.

A lifespan test system is used to carry out the lifespan test on the corresponding devices, and the test conditions are: at room temperature, and the air humidity is in the range of 30%~60%. The test results are shown in Table 3 below.

TABLE 3

| | Example 9 | Example 10 | Example 11 | Example 12 |
|---|---|---|---|---|
| T95(h) | 2.39 | 2.10 | 1.38 | 1.73 |

Example 13

The method for preparing quantum dots includes the following processes.

A mixture of hydroxyethyl methacrylate and n-octanoic acid is added to the CdZnSe/ZnSe quantum dot non-polar solvent at room temperature in the inert gas atmosphere.

After the temperature is raised to 60° C., the ligand exchange reaction is performed for 4 hours to obtain the first quantum dots solution with HEMA as the ligand. The molar ratio of the added amount of HEMA to the quantum dots is about 100~50:1. A mixture of 1,3,5-tris(4-carboxyphenyl)benzene and n-octanoic acid is added to the quantum dot non-polar solvent at room temperature in the inert gas atmosphere. After the temperature is raised to 100° C., and the ligand exchange reaction is performed for 8 hours to obtain the second quantum dots solution with 1,3,5-tris(4-carboxyphenyl) and HEMA as the ligands. After the reaction is over, the product is repeatedly dissolved, precipitated and centrifuged with n-hexane and ethanol for multiple times to obtain the quantum dot product dispersed in n-octane. A fatty acid solution including a certain proportion of AIBN (initiator, azobisisobutyronitrile) and EGDMA (crosslinking agent, ethylene glycol dimethacrylate) is added as a reaction catalyst for the polymerization of the quantum dot ligands.

Example 14

The method for preparing quantum dots includes the following processes.

A mixture of BMA and n-octanoic acid is added to the CdZnSe/ZnSe/ZnS quantum dot non-polar solvent at room temperature in the inert gas atmosphere. After the temperature is raised to 60° C., the ligand exchange reaction is performed for 4 hours to obtain the first quantum dots solution with BMA as the ligand, and the molar ratio of the added amount of BMA to the quantum dots is about 100~50:1. A mixture of 1,3,5-tris(4-carboxyphenyl)benzene and n-octanoic acid is added to the quantum dot non-polar solvent at room temperature in the inert gas atmosphere. After the temperature is raised to 100° C., the ligand exchange reaction is performed for 8 hours to obtain the second quantum dots solution with 1,3,5-tris(4-carboxyphenyl) and BMA as the ligands. After the reaction is over, the product is repeatedly dissolved, precipitated and centrifuged with n-hexane and ethanol for multiple times to obtain the quantum dot product dispersed in n-octane. A fatty acid solution including a certain proportion of AIBN (initiator, azobisisobutyronitrile) and EGDMA (crosslinking agent, ethylene glycol dimethacrylate) is added as the reaction catalyst for the polymerization of the quantum dot ligands.

Example 15

The method for preparing quantum dots includes the following processes.

A mixture of HEMA and n-octanoic acid is added to the CdZnSeS/ZnSe/ZnS quantum dot non-polar solvent at room temperature in the inert gas atmosphere. After the temperature is raised to 60° C., the ligand exchange reaction is performed for 4 hours to obtain the first quantum dots solution with HEMA as the ligand, and the molar ratio of the added amount of HEMA to the quantum dots is about 100~50:1. 1,3,5-tris(4'-carboxy [1,1'-biphenyl]-4-yl)benzene and n-octanoic acid are added to a non-polar solvent at room temperature in the inert gas atmosphere. After the temperature is raised to 100° C., the ligand exchange reaction is performed for 8 hours to obtain the second quantum dots solution with 1,3,5-tris(4'-carboxy [1,1'-biphenyl]-4-yl) benzene and HEMA as the ligands. After the reaction is over, the product is repeatedly dissolved, precipitated and centrifuged with n-hexane and ethanol for multiple times to obtain the quantum dot product dispersed in n-octane. A fatty acid solution including a certain proportion of AIBN (initiator, azobisisobutyronitrile) and EGDMA (crosslinking agent, ethylene glycol dimethacrylate) is added as the reaction catalyst for the polymerization of the quantum dot ligands.

Example 16

The method for preparing quantum dots includes the following processes.

A mixture of BMA and n-octanoic acid is added to the CdZnSeS/ZnS quantum dot non-polar solvent in the inert gas atmosphere at room temperature. After the temperature is raised to 60° C., the ligand exchange reaction is performed for 4 hours to obtain the first quantum dots solution with BMA as the ligand, and the molar ratio of the added amount of BMA to the quantum dots is about 100~50:1. 1,3,5-tris (4'-carboxy [1,1'-biphenyl]-4-yl)benzene mixed solution with n-octanoic acid is added to the non-polar solvent at room temperature in the inert gas atmosphere. After the temperature is raised to 100° C., the ligand exchange reaction is performed for 8 hours to obtain the second quantum dots solution with 1,3,5-tris(4'-carboxy [1,1'-biphenyl]-4-yl) benzene and BMA as the ligands. After the reaction is over, the product is repeatedly dissolved, precipitated and centrifuged with n-hexane and ethanol for multiple times to obtain the quantum dot product dispersed in n-octane. A fatty acid solution including a certain proportion of AIBN (initiator, azobisisobutyronitrile) and EGDMA (crosslinking agent, ethylene glycol dimethacrylate) is added as the reaction catalyst for the polymerization of the quantum dot ligands.

Using the quantum dots of examples 13-16 as the material of the quantum dot light-emitting layer in the quantum dot light-emitting diode, the method for preparing the quantum dot light-emitting diode includes the following processes.

An anode substrate is provided and a hole transport layer is prepared on the anode prefabricated device, The quantum dot solution prepared in examples 13-16 is deposited on the hole transport layer, and the hole transport layer is dried to prepare the quantum dot light-emitting layer.

A nano-zinc oxide electron transport layer is deposited on the quantum dot light-emitting layer and an annealing treatment is performed.

An aluminum electrode is vapor-deposited, and an electronic glue is used for packaging to obtain the quantum dot light-emitting diode.

The quantum dot light-emitting diode prepared by using the quantum dots of examples 13-16 as the quantum dot light-emitting layer is tested for its lifespan performance. The test method includes the following processes. When the quantum dot light-emitting diode device is driven by a constant current or voltage, the brightness of the device is reduced to a certain percentage of the highest brightness of the device. A time for the brightness of the device to drop to 95% of the highest brightness of the device is defined as T95, and the time is measured as the lifespan of the device. In order to shorten the test cycle, the device lifespan test is usually carried out by accelerating the aging of the device with reference to the OLED device test at a high brightness, and the decay fitting formula of the extended exponential decay brightness is used to fit the lifespan under the high brightness. For example, the lifespan of the device under 1000 nit is counted as T951000 nit. The specific calculation formula is as follows:

$$T95_L = T95_H \cdot \left(\frac{L_H}{L_L}\right)^A$$

where, $T95_L$ is the lifespan under a low brightness, $T95_H$ is the measured lifespan under a high brightness, LH is an acceleration of the device to the highest brightness, LL is 1000 nit, and A is an acceleration factor. For an OLED device, a value of A is in the range of 1.6~2. By measuring the lifespan of several groups of green QLED devices at rated brightness in this experiment, the value of A is determined to be about 1.7.

A lifespan test system is used to carry out the lifespan test on the corresponding devices, and the test conditions are: at room temperature, and the air humidity is in the range of 30%~60%. The test results are shown in Table 4 below.

TABLE 4

| | Example 13 | Example 14 | Example 15 | Example 16 |
|---|---|---|---|---|
| T95(h) | 2.14 | 1.98 | 1.27 | 1.62 |

The quantum dot material provided in the present disclosure has the first ligand bonded to the surface, and the first ligand is the MOF monomer. On one hand, due to the self-assembly properties of the MOF monomer, during the formation of the quantum dot film, under the drive of the MOF monomer, the orderly arrangement of the quantum dots with the MOF on the surface improves the uniformity of the quantum dot in the film-forming process. On the other hand, multiple MOF monomers are bonded to the surface of the quantum dot at the same time to form the framework structure similar to MOF, which can reduce the surface defects of the quantum dot. At the same time, the micropores between MOF monomers in the framework structure similar to MOF can be filled by the quantum dot, thereby improving the crystallinity of the quantum dot film and obtaining the high-quality superlattice quantum dot structure. The two aspects act at the same time to form the orderly arranged high-quality superlattice structure (similar to the framework structure of MOF). In this case, the orderly arranged high-quality superlattice structure can solve the problems of defects and loosely ordered structure when forming the quantum dot film, effectively improve the carrier transmission capacity, and improve the electrical conductivity of the quantum dot film.

The method for preparing the quantum dot material provided by the present disclosure includes: mixing the fatty acid solution of the first ligand and the mixed solution system of the first quantum dots, and under the action of the fatty acid, bringing the first ligand into contact with the first quantum dot; and performing the ligand exchange reaction under the heating condition to prepare the second quantum dots with the first ligand bonded to the surface. The method is simple and controllable, and can realize the bonding of the MOF monomers on the surface of the quantum dots. More importantly, the quantum dot material obtained by this method has the first ligand bonded to the surface, and the first ligand is the MOF monomer, which can form an orderly arranged high-quality superlattice structure (similar to the framework structure of MOF). In this case, the orderly arranged high-quality superlattice structure can improve the transport capacity of carriers and improve the conductivity of the quantum dot film.

In the quantum dot light-emitting diode provided by the present disclosure, the quantum dot light-emitting layer adopts the above-described quantum dot material. Therefore, the carrier transport capacity can be improved, the electrical conductivity of the quantum dot film can be improved, the recombination of excitons in the light-emitting layer can be improved, the charge accumulation at the interface between the quantum dot light-emitting layer and the electron transport layer can be reduced, and the lifespan and luminous efficiency of the quantum dot light-emitting device can be improved.

The method for preparing the quantum dot light-emitting diode provided in the present disclosure only needs to prepare the quantum dot film according to the conventional method to realize the preparation of the quantum dot light-emitting layer with the first ligand bonded to the surface. The method is simple, controllable, and easy to implement and reach industrialization. It is important that the quantum dot light-emitting diode prepared by this method can improve the transport capacity of carriers and the conductivity of the quantum dot film. Thus, the ability of excitons to recombine in the light-emitting layer is enhanced, the interaction between the quantum dot light-emitting layer and the quantum dot film is reduced, the accumulation of charge at the interface of the electron transport layer is reduced, and the lifespan and luminous efficiency of the quantum dot light-emitting device are improved.

The above-mentioned embodiments are only used to illustrate the technical solutions of the present disclosure, not to limit them. Although the present disclosure has been described in detail with reference to the foregoing embodiments, those of ordinary skill in the art should understand that the foregoing technical solutions described in the embodiments can be modified, or some of the technical features can be equivalently replaced. These modifications or replacements do not cause the essence of the corresponding technical solutions to deviate from the spirit and scope of the technical solutions of the embodiments of the present disclosure, and should be included in the scope of the present disclosure.

What is claimed is:

1. A quantum dot material, comprising:

quantum dot particles, and a first ligand directly bonded to a surface of the quantum dot particles, wherein the first ligand is an organic monomer used to form a metal-organic framework (MOF), and the organic monomer comprises at least three first active groups bonded to the quantum dot particles, whereby forming superlattice structure quantum dots with a framework structure similar to the MOF;

the quantum dot material further comprises: a second ligand bonded to the surface of the quantum dot particles, wherein the second ligand is selected from at least one of 2-aminoanthracene, biphenylmonoacetic acid, 4,4-stilbene dicarboxylic acid, biphenylmonoacetic acid, or 4,4-stilbene dicarboxylic acid, the second ligand comprises a second active group bonded to the quantum dot particles, and a molar ratio of the first ligand to the second ligand is about 1:0.95~1.05.

2. The quantum dot material according to claim 1, wherein:

the first ligand is selected from compounds having a structure shown in following Formula 1, wherein $X^1$, $X^2$, and $X^3$ are first active groups and are same or different:

Formula 1

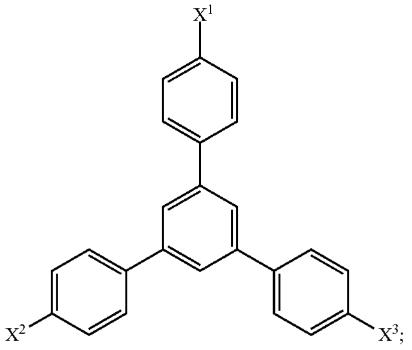

and the first active group is selected from one of a hydroxyl group, a carboxyl group, a mercapto group, and an amino group.

3. The quantum dot material according to claim 1, further comprising:

a third ligand bonded to the surface of the quantum dot particles, wherein the third ligand is a compound with a general structural formula shown in Formula 5, $X^7$ is a third active group bonded to the quantum dots, $R^1$ is $-(CH_2)_m-$, m is a positive integer, and m is approximately in the range of 1-10, and Formula 5

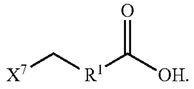

4. The quantum dot material according to claim 3, wherein:

the third active group is selected from one of a hydroxyl group, a carboxyl group, a mercapto group, and an amino group; and/or the third ligand is selected from at least one of suberic acid, pimelic acid, or azelaic acid.

5. The quantum dot material according to claim 1, further comprising:

a fourth ligand bonded to the surface of the quantum dot particles, wherein the fourth ligand is a compound with a general structural formula shown in Formula 6, R 2 is selected from carbon having number of atoms ranging approximately from 1 to 6, one end of R 2 includes a substituent of a fourth active group bonded to the quantum dot particles, the fourth ligand is cross-linked by a double-bond polymerization reaction to form a network structure, and Formula 6

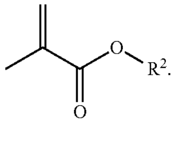

6. The quantum dot material according to claim 5, wherein:

the fourth active group is selected from one of a hydroxyl group, a carboxyl group, a mercapto group, and an amino group; and/or the fourth ligand is selected from at least one of hydroxyethyl methacrylate, hydroxypropyl methacrylate, or hydroxybutyl methacrylate.

7. A quantum dot light-emitting diode, comprising:

an anode;

a cathode arranged opposite to the anode;

a quantum dot light-emitting layer disposed between the anode and the cathode; and an electron transport layer disposed between the quantum dot layer and the cathode;

wherein a material of the quantum dot light-emitting layer is the quantum dot material according to claim 1.

8. A method for preparing the quantum dot material according to claim 1, the method comprising:

in an inert gas atmosphere, providing a fatty acid solution of a first ligand, and first quantum dots;

mixing the fatty acid solution of the first ligand and the first quantum dots to form a mixed solution system, and performing a ligand exchange reaction under a first heating condition to prepare second quantum dots with the first ligand bonded to a surface of the second quantum dots; and mixing the second quantum dots with the first ligand bonded to the surface of the second quantum dots and the fatty acid solution of a second ligand, and performing the ligand exchange reaction under a second heating condition to prepare third quantum dots with the first ligand and the second ligand bonded to a surface of the third quantum dots at the same time;

wherein a reactivity between the second active group and quantum dots is less than a reactivity between the first active group and the quantum dots.

9. The method for preparing the quantum dot material according to claim 8, wherein:

the first ligand is selected from compounds having a structure shown in Formula 1 below, wherein $X^1$, $X^2$, and $X^3$ are first active groups and are same or different, Formula 1

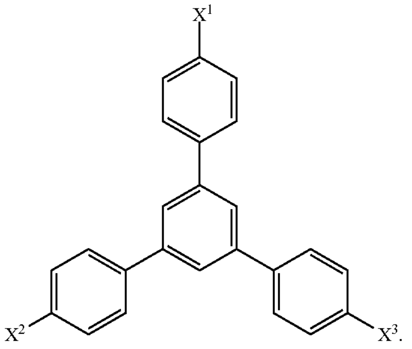

10. The method for preparing the quantum dot material according to claim 8, wherein:

when mixing the fatty acid solution of the first ligand and the first quantum dots to form the mixed solution system, the mixed solution system is configured according to a molar ratio of the first ligand to the first quantum dots in the range of 50~100:1; and mixing the fatty acid solution of the first ligand and the first quantum dots to form the mixed solution system includes separately configuring a fatty acid solvent of the first ligand and a non-polar solution of the first quantum dots, and mixing them to obtain the mixed solution system; and/or performing the ligand exchange reaction under the first heating condition, wherein a temperature of the first heating condition is approximately between 100° C. and 200° C., and a reaction time of the ligand exchange reaction is approximately between 20 min and 40 min.

11. The method for preparing the quantum dot material according to claim 8, further comprising after preparing the second quantum dots with the first ligand bonded to the surface of the second quantum dots:

mixing the second quantum dots with the first ligand bonded to the surface of the second quantum dots and the fatty acid solution of a second ligand, and performing the ligand exchange reaction under a second heating condition to prepare third quantum dots with the first ligand and the second ligand bonded to a surface of the third quantum dots at the same time;

wherein the second ligand is a compound having at least two benzene rings, the second ligand includes a second active group bonded to quantum dot particles of the third quantum dots, and a reactivity between the second active group and quantum dots is less than a reactivity between the first active group and the quantum dots.

12. The method for preparing the quantum dot material according to claim 8, wherein:

when mixing the second quantum dots with the first ligand bonded to the surface and the fatty acid solution of the second ligand, the second quantum dots and the second ligand are mixed according to a molar ratio of the second ligand to the second quantum dots in the range of 1:1~10:1; and/or when performing the ligand exchange reaction under the first heating condition, the reaction temperature of the first heating condition is in the range of 100° C.~200° C., and the reaction time of the ligand exchange reaction is in the range of 4 h~8 h, and when performing the ligand exchange reaction under the second heating condition, the reaction temperature of the first heating condition is in the range of 100° C.~150° C., and the reaction time of the ligand exchange reaction is in the range of 8 h~16 h.

13. The method for preparing the quantum dot material according to claim 8, further comprising after performing the ligand exchange reaction under the second heating condition:

dispersing the obtained reaction system in a polar solvent and collecting the third quantum dot precipitation;

dissolving the obtained third quantum dots in a non-polar solvent and repeating at least once and collecting the third quantum dots; and providing a third quantum dot solution and adding the second ligand into the third quantum dot solution.

14. The method for preparing the quantum dot material according to claim 8, wherein:

the first quantum dots are bonded with a third ligand to a surface of the first quantum dots, and the second quantum dots are bonded with the first ligand and the second ligand to the surface of the second quantum dots at the same time, wherein the third ligand is a compound with a general structural formula shown in Formula 5, $X^7$ is a third active group bonded to the quantum dots, $R^1$ is $-(CH_2)_m-$, m is a positive integer, and m is approximately in the range of 1-10, and Formula 5

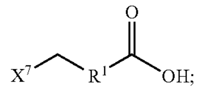

and preparing the first quantum dots includes:

in the inert gas atmosphere, providing a mixed solution system of a fatty acid solution of compound A and initial quantum dots, and performing a ligand exchange reaction under a third heating condition to prepare quantum dots with compound A bonded to a surface of the quantum dots, wherein the general formula of the structure of compound A is as follows, $X^7$ is the third active group bonded to the quantum dot, $R^1$ is $-(CH_2)_m-$, $R^3$ is a linear $C_sH_{2s+1}$, m and s are positive integers, s+m is in the range of 2~12, and Compound A

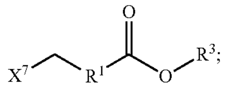

and hydrolyzing the compound A on the surface of the quantum dots to obtain the first quantum dots with the third ligand bonded to the surface.

15. The method for preparing the quantum dot material according to claim 14, wherein:

when performing the ligand exchange reaction under the third heating condition, the reaction temperature of the first heating condition is in the range of 100° C.~150° C., and the reaction time of the ligand exchange reaction is in the range of 1 h~2 h, and when performing the ligand exchange reaction under the first heating condition, the reaction temperature of the first heating condition is in the range of 100° C.~200° C., and the reaction time of the ligand exchange reaction is in the range of 8 h~16 h; and/or providing the mixed solution system of the fatty acid solution of the compound A and the initial quantum dots includes: separately configuring a fatty acid solvent of the compound A and a non-polar solution of the initial quantum dots, and mixing them to obtain the mixed solution system.

16. The method for preparing the quantum dot material according to claim 8, wherein:

the first quantum dots are bonded with a fourth ligand to the surface of the first quantum dots, and the second quantum dots are bonded with the first ligand and the fourth ligand to the surface of the second quantum dots at the same time, wherein the fourth ligand is a compound with a general structural formula shown in Formula 6, $R^2$ is selected from carbon having number of atoms ranging approximately from 1 to 6, one end of $R^2$ includes a substituent of a fourth active group bonded to the quantum dot particles, the fourth ligand is cross-linked by a double-bond polymerization reaction to form a network structure, and Formula 6

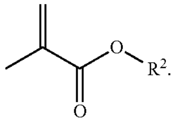

preparing the first quantum dots includes: in the inert gas atmosphere, providing a mixed solution system of a fatty acid solution of the fourth ligand and initial quantum dots, and performing a ligand exchange reaction under a fourth heating condition to prepare the first quantum dots with the fourth ligand bonded to the surface of the first quantum dots; and after performing the ligand exchange reaction under the fourth heating condition, the method further includes: adding a mixed solution including an initiator and a cross-linking agent, and polymerizing the fourth ligand on the surface of the second quantum dots through heating to prepare the second quantum dots bonded with the first ligand and the fourth ligand at the same time.

* * * * *